United States Patent
Suzuki et al.

(10) Patent No.: US 7,126,422 B2
(45) Date of Patent: Oct. 24, 2006

(54) MULTI-BAND FEED-FORWARD AMPLIFIER AND ADJUSTMENT METHOD THEREFOR

(75) Inventors: Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 45 days.

(21) Appl. No.: 11/043,638

(22) Filed: Jan. 27, 2005

(65) Prior Publication Data
US 2005/0163254 A1     Jul. 28, 2005

(30) Foreign Application Priority Data
Jan. 28, 2004     (JP)     ............. 2004-020045

(51) Int. Cl.
*H03F 1/00*     (2006.01)
(52) U.S. Cl. ....................... 330/151; 330/149
(58) Field of Classification Search ................ 330/151, 330/149; 375/297; 455/63
See application file for complete search history.

(56) References Cited

U.S. PATENT DOCUMENTS

| | | | |
|---|---|---|---|
| 6,172,565 B1 * | 1/2001 | Chen et al. ................. | 330/151 |
| 6,326,845 B1 * | 12/2001 | Miyaji et al. ............... | 330/151 |
| 6,392,483 B1 | 5/2002 | Suzuki et al. | |
| 6,801,083 B1 * | 10/2004 | Ishigami et al. ............. | 330/52 |
| 6,838,934 B1 | 1/2005 | Suzuki et al. | |
| 2002/0105379 A1 | 8/2002 | Nakayama et al. | |

FOREIGN PATENT DOCUMENTS

| | | | |
|---|---|---|---|
| EP | 1 014 564 A2 | 6/2000 | |
| EP | 1 030 441 A2 | 8/2000 | |
| EP | 1 041 712 A2 | 10/2000 | |
| JP | 1-198809 | 8/1989 | |
| JP | 2000-223961 | 8/2000 | |
| JP | 2001-284975 | 10/2001 | |

OTHER PUBLICATIONS

Toshio Nojima, et al., "Extremely Low-Distortion Multi-Carrier Amplifier for Mobile Communication Systems—Self Adjusting Feed-Forward Amplifier (SAFF-A)", Technical Report of Institute of Electronics Information and Communication Engineers of Japan, NTT Radio Communication Systems Laboratories, RCS90-4, 1990, pp. 21-28 (with partical English translation).

* cited by examiner

*Primary Examiner*—Henry Choe
(74) *Attorney, Agent, or Firm*—Oblon, Spivak, McClelland, Maier & Neustadt, P.C.

(57) ABSTRACT

A multi-band feed-forward amplifier is formed by: a dividing part for dividing and applying an input signal containing signals of multiple frequency bands to a linear signal path and N vector adjustment paths of a distortion detecting circuit; frequency band signal extractors provided in the N vector adjustment paths, respectively, for extracting signals of N frequency bands; N vector adjusters for adjusting the vectors of the output signals from the respective frequency band signal extractors; a main amplifier for amplifying the output signals from the N vector adjusters; a combining/dividing part for combining the amplified signals and the signal from the linear signal path of the distortion detecting circuit and for dividing and applying the combined output to a linear signal path and N distortion injection paths of a distortion cancelling circuit; frequency band signal extractors provided in the N distortion injection paths, respectively, for extracting the signals of the N frequency bands; vector adjusters for adjusting the vectors of signals separated into the N frequency bands; an auxiliary amplifying part for amplifying the vector-adjusted N signals; and a combining part for combining the amplified signals and the signal from the linear signal path of the distortion cancelling circuit.

24 Claims, 24 Drawing Sheets

FIG. 2  MULTI-BAND SIGNAL PROCESSING CIRCUIT
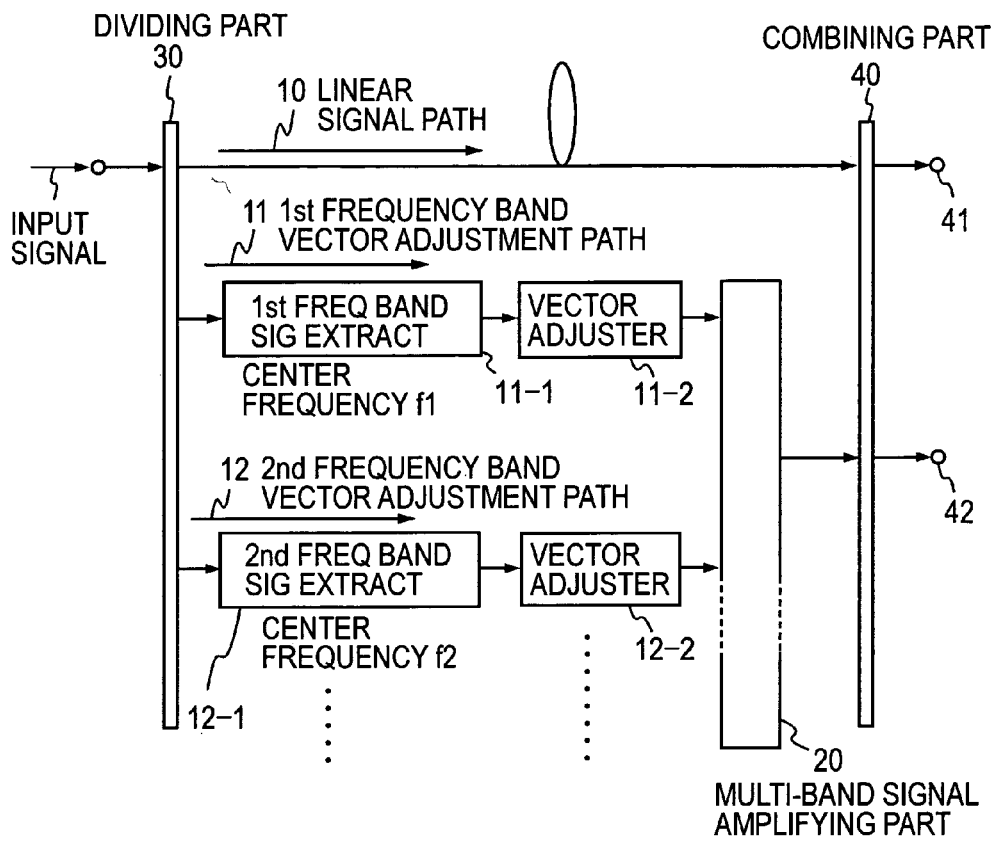
FIG. 3
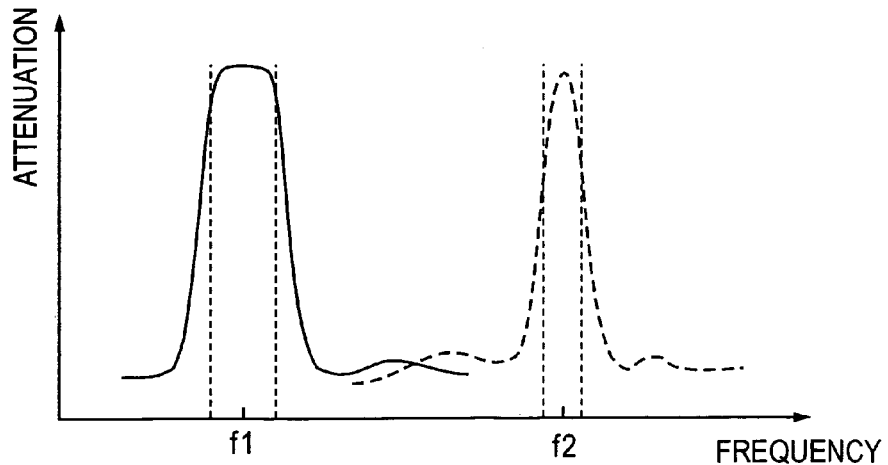

CONCEPT OF COMPENSATION FOR
DISTORTION BY PRESENT INVENTION

US 7,126,422 B2

MULTI-BAND FEED-FORWARD AMPLIFIER AND ADJUSTMENT METHOD THEREFOR

FIELD OF THE INVENTION

The present invention relates to a multi-band feed-forward amplifier for collectively or simultaneously amplifying signals of multiple frequency bands and a method for adjustment of the feed-forward amplifier.

DESCRIPTION OF THE PRIOR ART

In FIG. 1 there is shown the basic configuration of a conventional feed-forward amplifier. The feed-forward amplifier comprises in principle two signal processing circuits, one of which is a distortion detecting circuit 100 and the other of which is a distortion cancelling circuit 200. The distortion detecting circuit 100 is made up of a main amplifier signal path 101 and a linear signal path 102. The distortion cancelling circuit 200 is made up of a main signal path 201 and a distortion injection path 202. The main amplifier signal path 101 (hereinafter referred to also as a vector adjustment path) is composed of a vector adjuster 101V formed by a cascade connection of a variable phase shifter 101-1 and a variable attenuator 101-2, and a main amplifier 101-3, and the linear signal path 102 is formed by a delay line. The main signal path 201 is also formed by a delay line. The distortion injection path (hereinafter referred to also as a vector adjustment path) 202 is composed of a vector adjuster 202V formed by a cascade connection of a variable phase shifter 201-1 and a variable attenuator 202-2, and an auxiliary amplifier 202-3. In the illustrated prior art example, a power divider 301, a power divider/combiner 302, and a power combiner 303 are simple, no-loss power dividers and power combiners each formed by a transformer, hybrid circuit, or the like.

A description will be given first of the basic operation of the feed-forward amplifier. An input signal to the feed-forward amplifier is divided by the power divider 301 and applied to the main amplifier signal path 101 and the linear signal path 102. The variable phase shifter 101-1 and the variable attenuator 101-2 of the main amplifier signal path 101 are adjusted so that the signals of the main amplifier signal path 101 and the linear signal path 102 become equal in amplitude to but 180° out of phase with each other at the power combiner/divider 302. The 180° out-of-phase relationship between the two signals can be established by setting a proper amount of shift between input and output terminals in the power divider 301 or power divider/combiner 302, or through utilization of a phase inversion in the main amplifier 101-3. The power combiner/divider 302 produces at its one and the other output terminals a sum of the signals from the main amplifier signal path 101 and the linear signal path 102 and a difference therebetween, respectively.

Because of such a configuration of the distortion detecting circuit 100, a difference component between the signals from the main amplifier signal path 101 and the linear signal path 102 is detected at the output side of the power combiner/divider 302. This difference component is exactly the distortion component that is developed in the main amplifier 103-3. For this reason, the block 100 in FIG. 1 is called the distortion detecting circuit.

Next, the distortion cancelling circuit 200 will be described below. The sum component output from the power combiner/divider 302 is applied to the main signal path 201 and the difference component output from the combiner/divider 302 is applied to the distortion injection path 202. The sum component input to the main signal path 201 consists of the output from the main amplifier 101-3 and contains the distortion component of the main amplifier signal path 101-3 of the distortion detecting circuit 100. The difference component input to the distortion injection path 202 consists of the distortion component itself of the main amplifier 101-3 detected by the distortion detecting circuit 100. The variable phase shifter 202-1 and the variable attenuator 202-2 in the distortion injection path 202 are adjusted so that the distortion components from the main signal path 201 and the distortion injection path 202 become equal in amplitude to but 180° out of phase with each other. As a result, the distortion component of the main amplifier 101-3 is injected into the output from the distortion cancelling circuit 200 in the 180° out-of-phase with and equal in amplitude to the distortion component output from the distortion injection path 202, thereby canceling the overall distortion component of the amplifier circuit.

Though well-known in the art, a linear amplifier is used as the auxiliary amplifier 202-3 for canceling the distortion component that is generated by the main amplifier 101-3 used in the feed-forward amplifier.

The above is an ideal operation of a feed-forward amplifier. In practice, however, it is not easy to keep perfect balance of each of the distortion detecting circuit 100 and the distortion cancelling circuit 200. Even if their initialization is perfect, extreme difficulty is encountered in stably maintaining them in an excellent state of balance for a long time because the amplifier characteristics vary with changes in the ambient temperature, the power-supply voltage, and so forth.

To keep the distortion detecting circuit 100 and the distortion cancelling circuit 200 of the feed-forward amplifier in balance with high accuracy, there has been proposed, for example, in Japanese patent application laid open No. 198809/89, hereinafter referred to as patent document 1, an automatic adjustment method using pilot signals. An actual implementation of such a method is disclosed in the literature by Toshio Nojima and Shoichi Narahashi, "Extremely Low-Distortion Multi-Carrier Amplifier for Mobile Communication Systems,—Self-Adjusting Feed-Forward Amplifier (SAFF-A)—, Technical Report of Institute of Electronics Information and Communication Engineers of Japan, RCS90-4, 1990, hereinafter referred to as non-patent document 1. Such feed-forward amplifiers have been actually manufactured for use in 800 MHz and 1.5 MHz bands of a PDC (Personal Digital Cellular) system in Japan. In general, the feed-forward amplifiers are each designed and adjusted for one of the frequency bands of the signals to be amplified.

In Japanese patent applications laid open Nos. 223961/00 and 284975/01, hereinafter referred to as patent documents 2 and 3, there are proposed a feed-forward amplifier which subdivides, for example, a 20 MHz range in a 2 GHz band by use of multiple band pass filters, amplifies signals extracted by the subdivision, compensate for amplitude and phase deviations developed by an amplifier for each subdivided frequency band, thereby providing increased accuracy in distortion compensation.

When two or more frequency bands for signal amplification are spaced far apart as compared with their bandwidths, that is, when the frequency bands of signals to be amplified are discrete, since the electrical lengths of the delay lines differ for each frequency band, the amounts of adjustment of the variable phase shifters 101-1 and 202-1 and the variable attenuators 101-2 and 202-2 of the distortion detecting circuit 100 and the distortion cancelling circuit 200 of the feed-forward amplifier to bring each of the distortion detecting circuit 100 and the distortion cancelling circuit 200 into balance differ among the frequency bands for signal amplification. For example, even if an optimum adjustment is made for a signal of 800 MHz band, it is not optimum for a signal of 1.5 GHz band as far apart from 800 MHz band as 700 MHz. On this account, the feed-forward amplifier of the type which simultaneously amplifies signals of the 800 MHz and 1.5 GHz bands as mentioned above cannot simultaneously provide predetermined amounts of compensation for distortions in the respective frequency bands. It is conventional to use different feed-forward amplifiers for the 800 MHz and 1.5 GHz bands, respectively.

In the patent documents 2 and 3, no band pass filter is provided in the distortion cancelling circuit and only one vector adjuster is used to make the vector adjustment. With such a configuration, it is impossible to perform simultaneous distortion cancellation, for example, in the 800 MHz and 1.5 GHz bands.

Specifically speaking, where feed-forward amplifiers, each capable of performing distortion compensation in one of frequency bands, are combined by a common delay line, vector adjusters of the distortion detecting circuit and the distortion cancelling circuit are supplied with signals of the respective frequency bands. The vector adjusters cannot make optimum vector adjustment for the respective frequency bands. For example, when signals of the 800 MHz and 1.5 GHz bands are input to the same vector adjuster, an optimum vector adjustment can be made for either one of the two frequency bands, but no optimum vector adjustment can be performed for the other frequency band. In other words, no distortion compensation can be carried out in the other frequency band. The reason for this is that the vector adjuster can adjust the amplitude and phase of the signal of one frequency band alone.

The use of the feed-forward amplifier for each frequency band is disadvantageous in the overall size and power consumption of the system as compared with those in the case of using one feed-forward amplifier common to the respective frequency bands.

SUMMARY OF THE INVENTION

It is therefore an object of the present invention to provide a feed-forward amplifier that permits simultaneous compensation for distortion in multiple frequency bands.

According to the present invention, there is provided a feed-forward amplifier having a distortion detecting circuit and a distortion cancelling circuit.

The distortion detecting circuit comprises:

a first linear signal path formed by first delay means;

N first vector adjustment paths, said N being an integer equal to or greater than 2;

a first dividing part for dividing the input signal to said distortion detecting circuit into two, the one of which is provided to said first linear signal path and the other of which is provided to said N first vector adjustment paths;

N first frequency band signal extractors provided in said N first vector adjustment paths, respectively, for extracting signals of N discrete frequency bands;

N first vector adjusters provided in said N first vector adjustment paths, respectively, for adjusting the phases and amplitudes of the output signals from said first frequency band signal extractors;

a first multi-band signal amplifying part for amplifying the outputs from said N first vector adjusters, and a first combining part for combining the output from said first linear signal path and the output from said first multi-band signal amplifying part.

The distortion cancelling circuit comprises:

a second linear signal path formed by second delay means;

N second vector adjustment paths;

a second dividing part for dividing and applying the input signal to said distortion cancelling circuit to said second linear signal path and said N second vector adjustment paths;

N second frequency band signal extractors provided in said N second vector adjustment paths, respectively, for extracting signals of discrete frequency bands;

N second vector adjusters provided in said N second vector adjustment paths, respectively, for adjusting the phases and amplitudes of the output signals from said N second frequency band signal extractors;

a second multi-band signal amplifying part for amplifying the outputs from said N second vector adjusters; and a second combining part for combining the output from said second linear signal path and the output from said second multi-band signal amplifying part.

According to the adjustment method of the present invention, the output signal from the distortion detecting circuit is detected, and the N first vector adjusters are controlled to minimize the detected signal level. The output signal from the distortion cancelling circuit is detected, and the N second vector adjusters are controlled to minimize the detected signal level.

The present invention permits implementation of a feed-forward amplifier capable of compensating for distortion in multiple frequency bands.

The present invention permits simplification of the configuration of the feed-forward amplifier for simultaneously amplifying signals of multiple frequency bands.

With the configuration of the present invention, it is possible to make adjustment that achieve predetermined compensation for distortion for each frequency band irrespective of the electrical length of the delay line forming the linear signal path.

BRIEF DESCRIPTION OF THE DRAWINGS

FIG. 2 is a block diagram explanatory of the basic configuration of a multi-band signal processing circuit according to the present invention;

FIG. 3 is a graph for explaining characteristics of a band pass filter forming a frequency band extractor in the multi-band signal processing circuit according to the present invention;

DETAILED DESCRIPTION OF THE PREFERRED EMBODIMENTS

Figure 1:
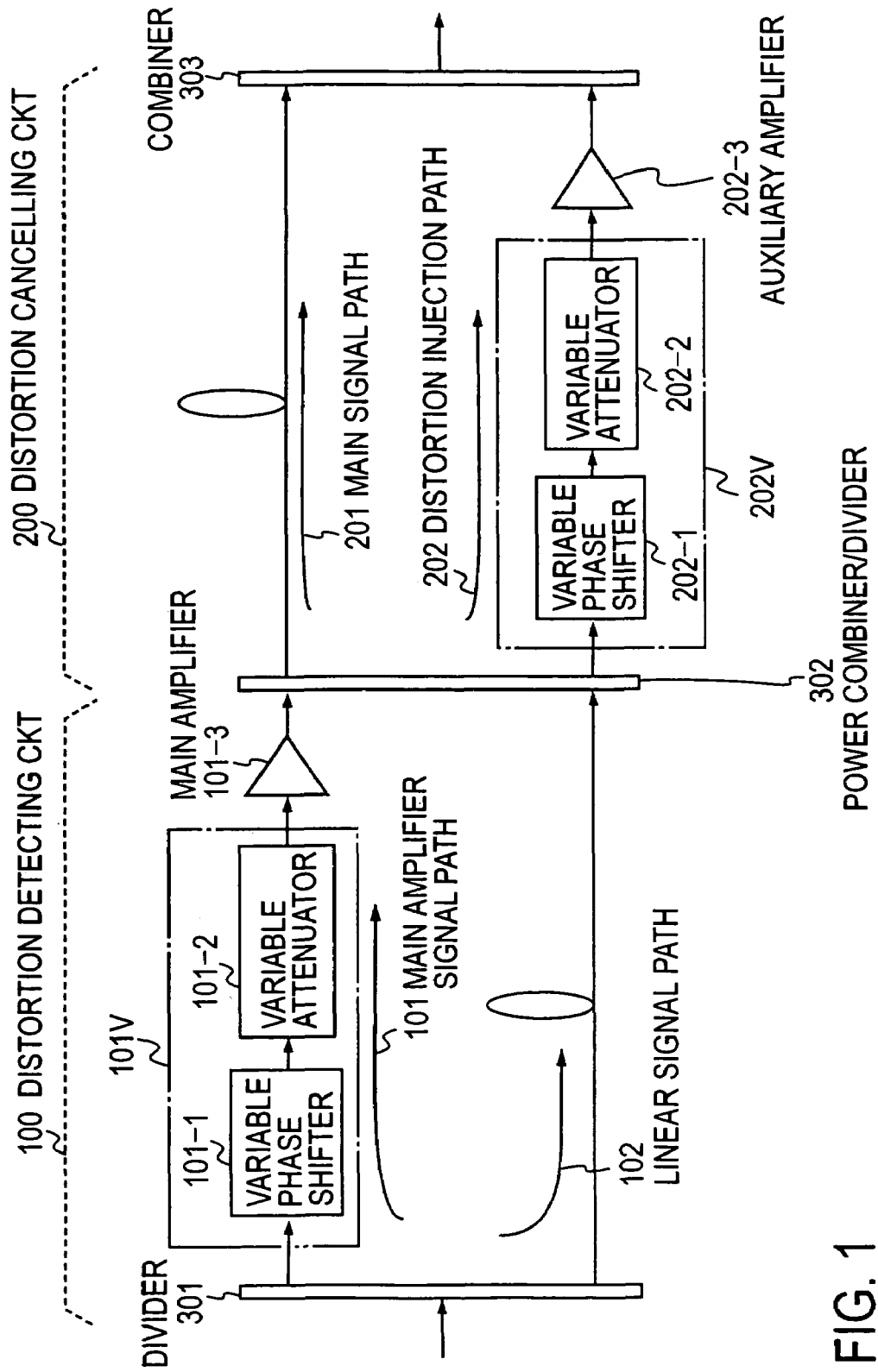
FIG. 1 is a block diagram explanatory of the basic configuration of a conventional feed-forward amplfier and its operation.

FIG. 2 illustrates the basic configuration of a multi-band signal processing circuit for use in the feed-forward amplifier of the present invention. The multi-band signal processing circuit comprises: a linear signal line 10 formed by a delay line; respective frequency band vector adjustment paths 11, 12, . . . ; a multi-band signal amplifying part 20 for amplifying signals from the respective frequency band vector adjustment paths 11, 12, . . . ; a dividing part 30 for dividing the input signal thereto to the linear signal path 10 and the respective frequency band vector adjustment paths 11, 12, . . . ; and a combining part 40 for combining the output from the multi-band signal amplifying part 20 and the output from the linear signal path 10.

The first frequency band vector adjustment path 11 contains a first frequency band signal extractor 11-1 for extracting a first frequency band signal of a center frequency f1, and a vector adjuster 11-2 for adjusting the amplitude and phase of the first frequency band signal. The second frequency band vector adjustment path 12 contains a second frequency band signal extractor 12-1 for extracting a second frequency band signal of a center frequency f2, and a vector adjuster 12-2 for adjusting the amplitude and phase of the second frequency band signal. The output signals from the vector adjusters 11-2 and 12-2 are amplified in the multi-band signal amplifying part 20.

In FIG. 2 it is shown that other frequency vector adjustment paths may be provided. The vector adjusters 11-2 and 12-2 are each formed, for example, by a series connection of a variable attenuator and a variable phase shifter, though no shown. The dividing part 30 divides the input signal to the linear signal path 10 and the first and second frequency band vector adjustment paths 11 and 12. The combining part 40 combines the output signals from the linear signal path 10 and the first and second frequency band vector adjustment paths 11 and 12. By applying the illustrated multi-band signal processing circuit to the distortion detecting circuit 100 and the distortion cancelling circuit 200 of the feed-forward amplifier described previously with respect to FIG. 1, for instance, it is possible to constitute the feed-forward amplifier of the present invention.

For example, in mobile communications the frequency f1 corresponds to, for example, a 800 MHz band, and the frequency f2 corresponds to a 1.5 GHz band; furthermore, 2 GHz and 5 GHz bands may be used as frequencies f3 and f4 (not shown), respectively. These frequency bands bear well spaced, discrete relationships as compared with their bandwidths, and the frequency band signal extractors 11-1, 12-1, . . . are provided in correspondence to the respective frequency bands. Signals of the respective frequency bands extracted by the frequency band signal extractors 11-1, 12-1, . . . are vector-adjusted by the vector adjusters 11-2, 12-2, . . . , then the vector-adjusted signals are amplified in the multi-band signal amplifying part 20, and in the combining part 40 the amplified outputs are combined with the output from the linear signal path 10. The number of frequency bands of signals to be processed by the multi-band signal processing circuit in the present invention is not limited specifically to two as described above, but in the interests of brevity the following description will be given on the assumption that the number of frequency bands is two.

The first and second frequency band signal extractors 11-1 and 12-1 have desired bandwidths with center frequencies f1 and f2, respectively, and they extract signals of the first and second frequency bands. Such frequency band signal extractors 11-1 and 12-1 may each be formed, for example, by a band pass filter (BPF), or band elimination filter (BEF).

In FIG. 3, frequency-attenuation characteristics of the first and second frequency band signal extractors 11-1 and 12-1, each formed by the band pass filter, are conceptually shown by solid and broken lines, respectively. The characteristics need to be such that the amount of attenuation sharply increases outside the frequency bands of the center frequencies f1 and f2, providing sufficient spacing between the frequency bands. Such characteristics can usually obtained by a cascade connection of multiple band pass filters.

Figure 4:
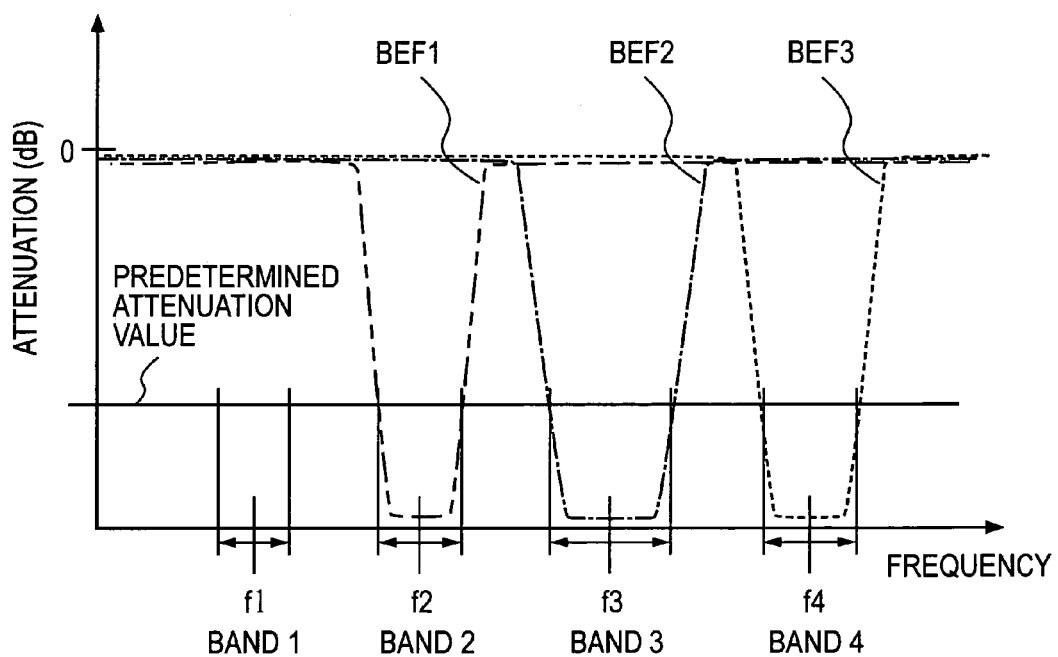
FIG. 4 is a graph for explaining characteristics of a band elimination filter forming a frequency band extractor in the multi-band signal processing circuit according to the present invention.
Figure 5:
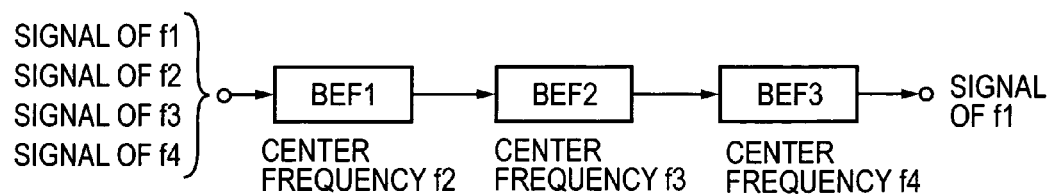
FIG. 5 is a block diagram showing a frequency band extractor formed by the band elimination filter.

FIG. 4 shows frequency-attenuation characteristics of the first frequency band signal extractor 11-1 formed by a BEF, for instance. This example conceptually shows the characteristic that the first frequency band signal extractor 11-1 is required to have when third and fourth vector adjustment paths for frequency bands of center frequencies f3 and f4 are added to the multi-band signal processing circuit of FIG. 2. The illustrated characteristic can be obtained, as is evident from FIG. 4, by such a cascade connection of three BEFs BEF1, BEF2 and BEF3 as shown in FIG. 5 which eliminate the second, third and fourth frequency bands, respectively, except the first frequency band. Each BEF is so configured to have a sufficient band elimination characteristic in the corresponding band and a sufficiently low-loss pass characteristic in other bands. the BEF can be formed, for example, by a notch filter. The notch filter is a BEF using a dielectric resonator, a filter using a stub formed by a microstrip line, or the like. Though not shown, the characteristic of the second frequency band signal extractor 12-1 can also be obtained similarly by a cascade connection of three BEFs that eliminate the first, third and fourth frequency bands, respectively. The same holds true for third and fourth frequency band signal extractors that are not shown.

The use of the BPF for each frequency band signal extractor facilitates extraction of a signal around the center frequency and makes it relatively easy to provide isolation from the center frequencies of adjacent frequency bands. In this instance, however, since the center frequency is the resonance frequency of the BPF, a signal delay increases. Consequently, it is necessary that the length of the delay line forming the linear signal path 10 in FIG. 2 is increased in accordance with the signal delay—this leads to the defect of increased amount of attenuation. With the use of the BEF for each frequency band signal extractor, since the BEF has no center frequency in the frequency band in which to extract the signal. Therefore, the signal delay is smaller than that of the BPF in that frequency band, permitting reduction in the length of the linear signal path 10 and in the amount of attenuation and hence in the propagation loss. Besides, it is also easy to design the BEF.

The length of the linear signal path 10 is predetermined such that the amount of signal delay by the linear signal path 10 becomes nearly equal to the amounts of delay by the vector adjustment paths 11 and 12 at the input of the combining part 40. The vector adjuster 11-2 controls the phase and amplitude of a signal on the first frequency band vector adjustment path 11. Therefore, a first frequency band signal component in the output signal from the linear signal path 10 and a first frequency band signal component in the output from the multi-band signal amplifying part 20 become equal in amplitude to but 180° out of phase with each other. Similarly, the vector adjuster 12-2 controls the phase and amplitude of a signal on the second frequency band vector adjustment path 12. Therefore, a second frequency band signal component in the output signal from the linear signal path 10 and a second frequency band signal component in the output from the multi-band signal amplifying part 20 become equal in amplitude to but 180° out of phase with each other. As a result of this, the combining part 40 provides the difference component between and the sum component of the output from the linear signal path 10 and the combined output of the respective vector adjustment paths to terminals 41 and 42, respectively.

The vector adjusters 11-2 and 12-2 of the first and second vector adjustment paths 11 and 12 in the multi-band signal processing circuit in FIG. 2 each make the adjustment with reference to the linear signal path 10. This enables independent vector adjustment for the frequencies f1 and f2.

A description will be given below of embodiments of the respective parts and constituent elements. In each embodiment, the "parts" each refer to a part that can be formed by an analog circuit or implemented by a digital processing unit and software.

Figure 6:
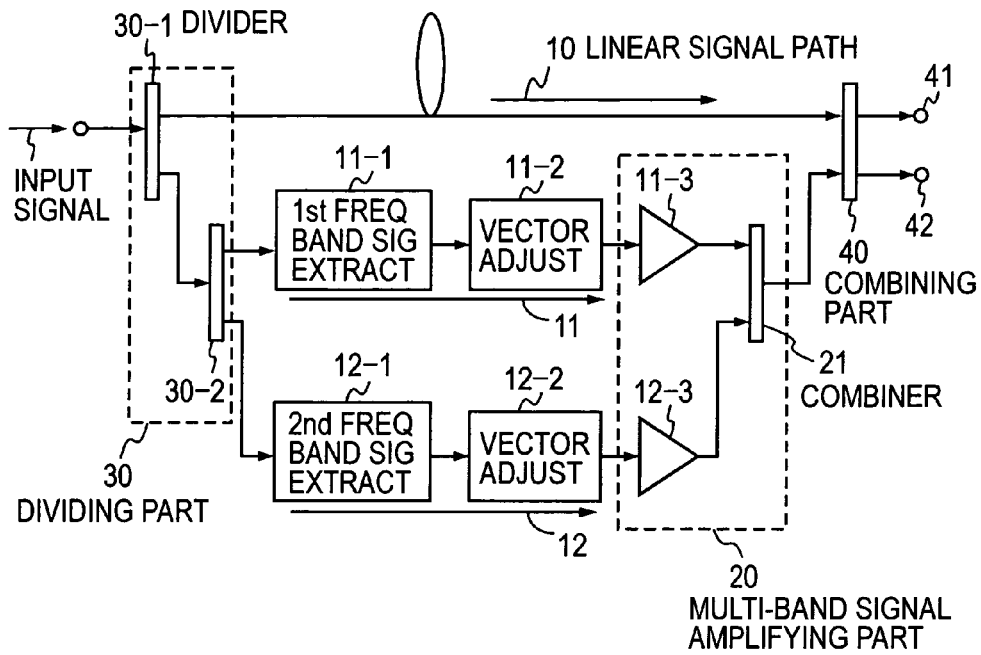
FIG. 6 is a block diagram for explaining an embodiment of the multi-band signal processing circuit according to the present invention.

FIG. 6 illustrates a more specific first example of the multi-band signal processing circuit shown in FIG. 2. In this example, the multi-band signal amplifying part 20 is comprised of individual amplifiers 11-3 and 12-3 for amplifying signals of the respective frequency bands, and a combiner 21 for combining the outputs from the amplifiers 11-3 and 12-3 into the output from the multi-band signal amplifying part 20. The dividing part 30 is made up of a divider 30-1 for dividing the input signal to two, one of which is provided to the linear signal path 10, and a divider 30-2 for dividing the other divided signal to the vector adjustment paths 11 and 12 of the respective frequency bands. The adjustment of the signal vector by the vector adjustment paths 11 and 12 and the difference and sum components at the output terminal 41 and 42 of the combining part 40 in this example are the same as in the case of FIG. 2, and therefore no description will be repeated. The combiner 21 for combining the output signals from the respective vector adjustment paths 11 and 12 may be formed by a directional coupler, Wilkinson power combiner, or the like.

Figure 7:
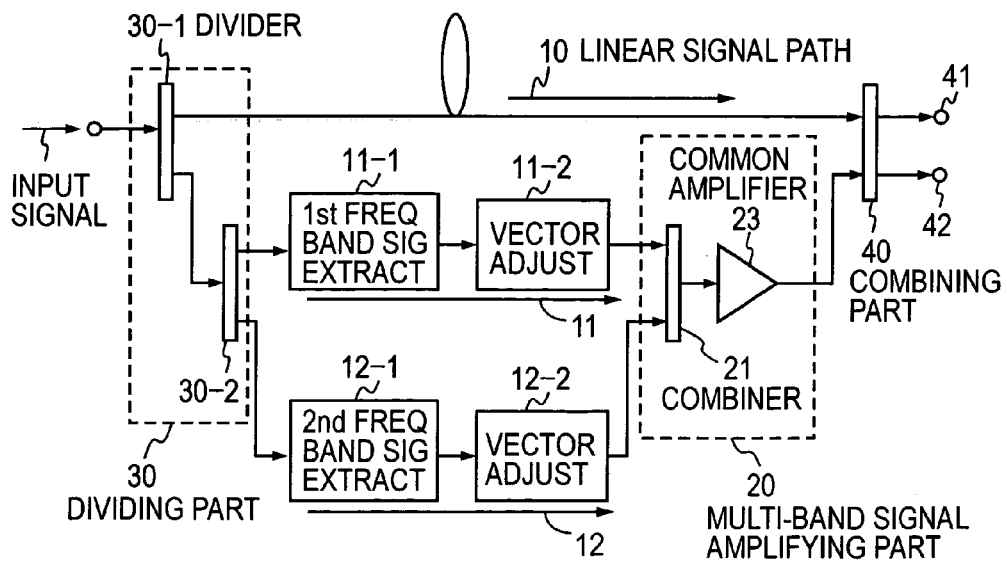
FIG. 7 is a block diagram for explaining another embodiment of the multi-band signal processing circuit according to the present invention.

FIG. 7 illustrates a second example of the multi-band signal processing circuit. This example is a modified form of the embodiment of FIG. 6, in which the multi-band signal amplifying part 20 is formed by the combiner 21 and a common amplifier 23. That is, the outputs from the vector adjusters 11-2 and 12-2 are combined by the combiner 21, and the combined multi-band signal is amplified by the common amplifier 23, the amplified output from which is provided as the output from the multi-band signal amplifying part 20 to the combiner 40. The other parts are identical to the corresponding parts in FIG. 6, and no description will be repeated in respect of them.

Embodiment 1

Figure 8:
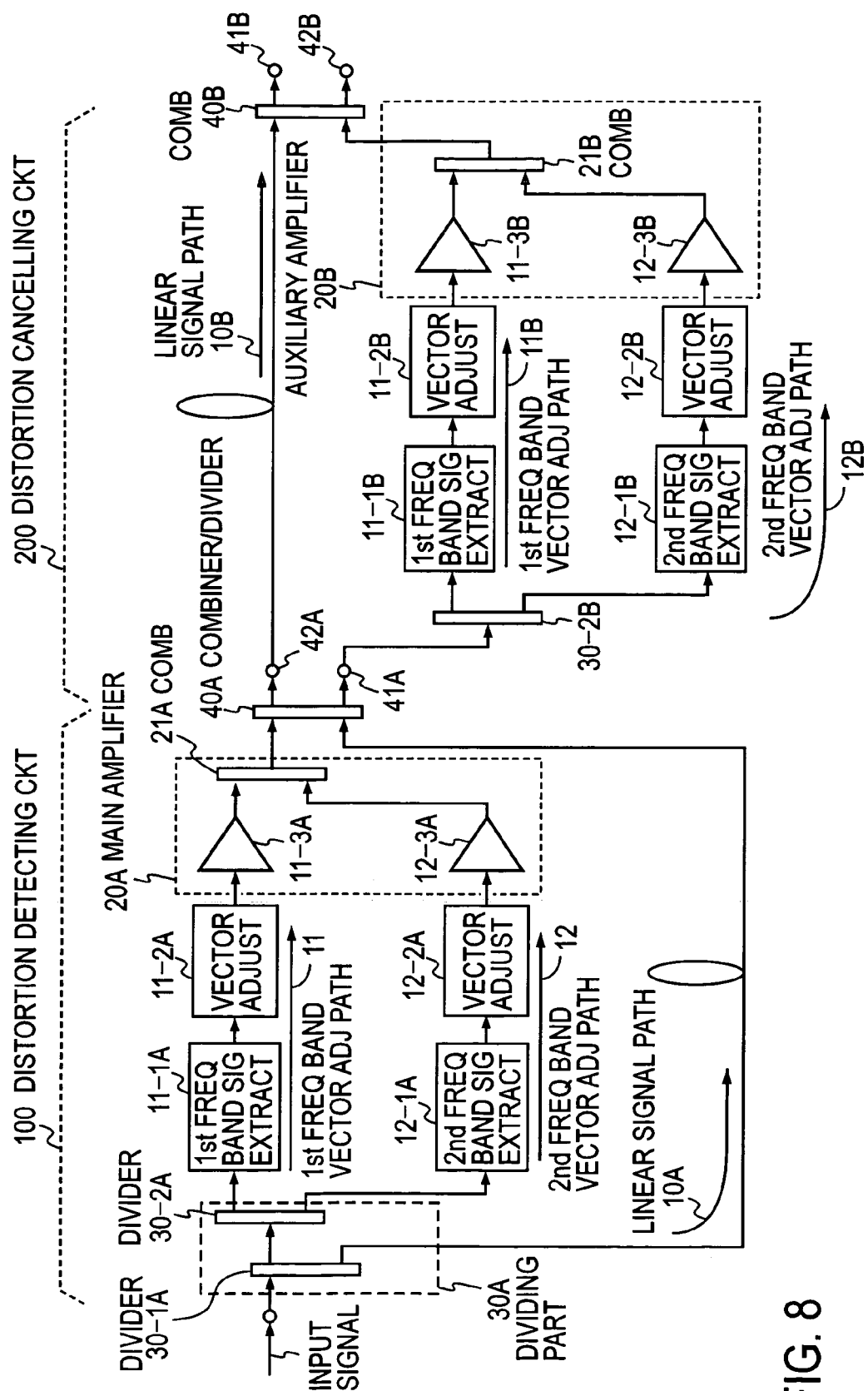
FIG. 8 is a block diagram for explaining an embodiment of the feed-forward amplifier according to the present invention.

FIG. 8 illustrates in block form a first embodiment of the feed-forward amplifier according to the present invention. This embodiment uses, as the distortion detecting circuit 100, the multi-band signal processing circuit shown in FIG. 6, the respective parts being denoted by reference numerals added with a suffix "A." Also this embodiment uses, as the distortion cancelling circuit 200, the multi-band signal processing circuit of FIG. 6, the respective parts being denoted by reference numerals being added with a suffix "B." The following embodiments of the invention will be described as using two frequency bands for the brevity of description, but in general more than two frequency bands can be used as desired.

The combining part 40A of the multi-band signal processing circuit forming the distortion detecting circuit 100 is used also as the divider 30-1 (see FIG. 6) in the multi-band signal processing circuit forming the distortion cancelling circuit 200, and hence it functions as a combiner/divider. The multi-band signal amplifying part 20A formed by the individual amplifiers 11-3A and 12-3A in the distortion detecting circuit 100 constitutes a main amplifier in the feed-forward amplifier. The individual amplifiers 11-3A and 12-3A are each formed by a power amplifier. The multi-band signal amplifying part 20B in the distortion cancelling circuit 200 constitutes an auxiliary amplifier in the feed-forward amplifier. The individual amplifiers 11-3B and 12-3B are each formed by a linear amplifier.

With the multi-band feed-forward amplifier configured as described above, the output terminal 41A of the combiner/divider 40A provides the difference component between the output from the linear signal path 10A and the combined output from the vector adjustment paths 11A and 12A (i.e., the output from the combiner 21A). Besides, the output terminal 42A of the combiner/divider 40A provides the sum component of the output from the linear signal path 10A and the output from the combiner 21A. Since the power amplifiers forming the individual amplifiers 11-3A and 12-3A generate intermodulation distortion during signal amplification, the difference component provided to the terminal 41A is distortion components produced by the individual amplifiers 11-3A and 12-3A. On the other hand, a combined signal of the multi-band input signal and the output signals from the individual amplifiers 11-3A and 12-3B is provided as the sum component to the terminal 42A.

In the distortion cancelling circuit 200, the combining part 40B output s to the terminal 41B the difference component between the output from the linear signal path 10B and the combined output from the vector adjustment paths 11B and 12B (the output from the combiner 21). Accordingly, the distortion component in the output signal from the linear signal path 10B produced by the main amplifier 20A is cancelled by the combined output from the vector adjustment paths 11B and 12B, and the multi-band signal components are output to the terminal 41B.

The distortion cancellation in such the distortion cancelling circuit 200 can be achieved by making vector adjustments in the distortion detecting circuit 100 and the distortion cancelling circuit 200 as described previously with reference to the multi-band signal processing circuit depicted in FIG. 2.

The feed-forward amplifier of the first embodiment uses the vector adjusters 11-2A, 11-2B and 12-2A, 12-2B for respective frequency bands, and hence it is capable of making independent distortion compensation for each frequency band. The vector adjusters 11-2A, 12-2A and 11-2B, 12-2B control the amplitudes and phases of the signals fed thereto so that they become equal in amplitude, opposite in phase and equal in delay to signals on the linear signal paths (delay lines) 10A and 10B in the distortion detecting circuit 100 and the distortion cancelling circuit 200, respectively.

Figure 9:
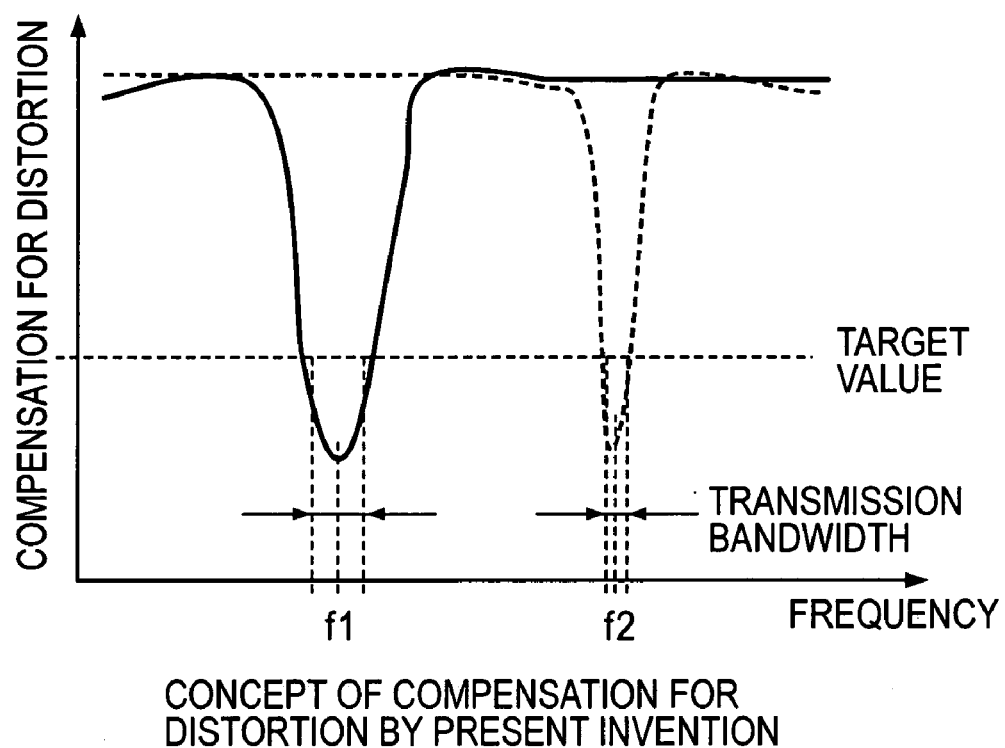
FIG. 9 is a graph for explaining distortion compensation by the feed-forward amplifier of the present invention.

FIG. 9 conceptually shows the amount of compensation for distortion made when signals of two frequency bands were amplified by the feed-forward amplifier of FIG. 8. In the feed-forward amplifier of the present invention, the vector adjusters 11-2A, 12-2A and 11-2B, 12-2B of the distortion detecting circuit 100 and the distortion cancelling circuit 200 are adjusted for the respective frequency bands. Therefore, the distortion components by the main amplifier 20A contained in the amplified signals of the respective frequency bands of the center frequencies f1 and f2 become equal to or smaller than predetermined values (target values) independently of each other.

With the vector adjustment paths sufficiently isolated from each other, the adjustment of the vector adjuster for one frequency band does not exert any influence on the adjustment of the vector adjuster of the other frequency band. Thus the vector adjusters for multiple frequency bands can be adjusted independently of each other. The addition of such vector adjustment paths provides flexibility to the addition of frequency bands in which to compensate for the distortion generated by the feed-forward amplifier.

The vector adjusters 11-2A, 12-2A in the feed-forward amplifier of the first embodiment may be provided in parallel to each other in the linear signal path 10A, and the vector adjusters 11-2B and 12-2B may also provided in parallel to each other in the linear signal path 10B. The same goes for all of the embodiments described below.

Either a BPF and BEF can form the first and second frequency band signal extractors in the feed-forward amplifier of the first embodiment, the BPFs may also be used as the first and second frequency band signal extractors 11-1A and 12-1A of the distortion detecting circuit 100, and the BEFs may also be used as the first and second frequency band signal extractors 11-1B and 12-1B of the distortion cancelling circuit 200. Similarly, it is also possible to use the BEFs as the first and second frequency extractors 11-1A and 12-1A of the distortion detecting circuit 100 and the BPFs as the first and second frequency band signal extractors 11-1B and 12-1B of the distortion cancelling circuit 200.

Embodiment 2

Figure 10:
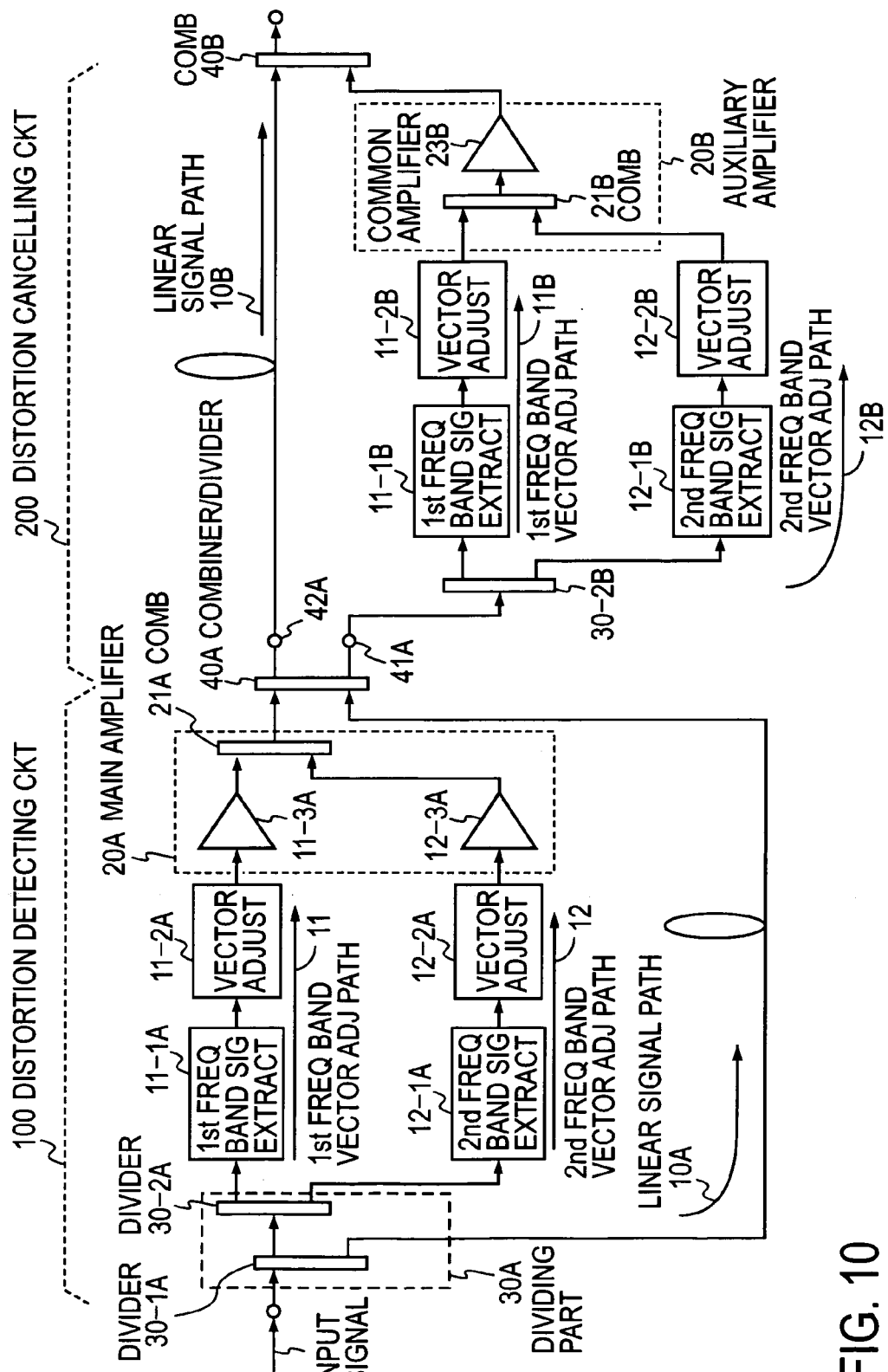
FIG. 10 is a block diagram for explaining another embodiment of the feed-forward amplifier of the present invention.

FIG. 10 illustrates in block form a second embodiment of the feed-forward amplifier according to the present invention. This embodiment uses, as the distortion cancelling circuit 200 in the FIG. 8 embodiment, the multi-band signal processing part shown in FIG. 7. The feed-forward amplifier of this embodiment also makes vector adjustment by use of the vector adjusters 11-2A, 11-2B and 12-2A, 12-2B for the respective frequency bands, and hence it permits compensation for distortion independently for each frequency band. With the vector adjustment paths sufficiently isolated from each other, the adjustment of the vector adjuster for one frequency band does not exert any influence on the vector adjustment of the vector adjuster for the other frequency band. Thus the vector adjusters for multiple frequency bands can be adjusted independently of each other. Simple addition of a required vector adjustment path provides flexibility to the addition of a desired frequency band in which distortion by the feed-forward amplifier is compensated for.

Since the auxiliary amplifier 20B of the distortion cancelling circuit 200 is formed by a single common amplifier 23B that simultaneously amplifies signals of multiple frequency bands as shown in FIG. 7, it is possible to achieve simplification of the device configuration and power savings from reduction in the number of amplifiers used.

Embodiment 3

Figure 11:
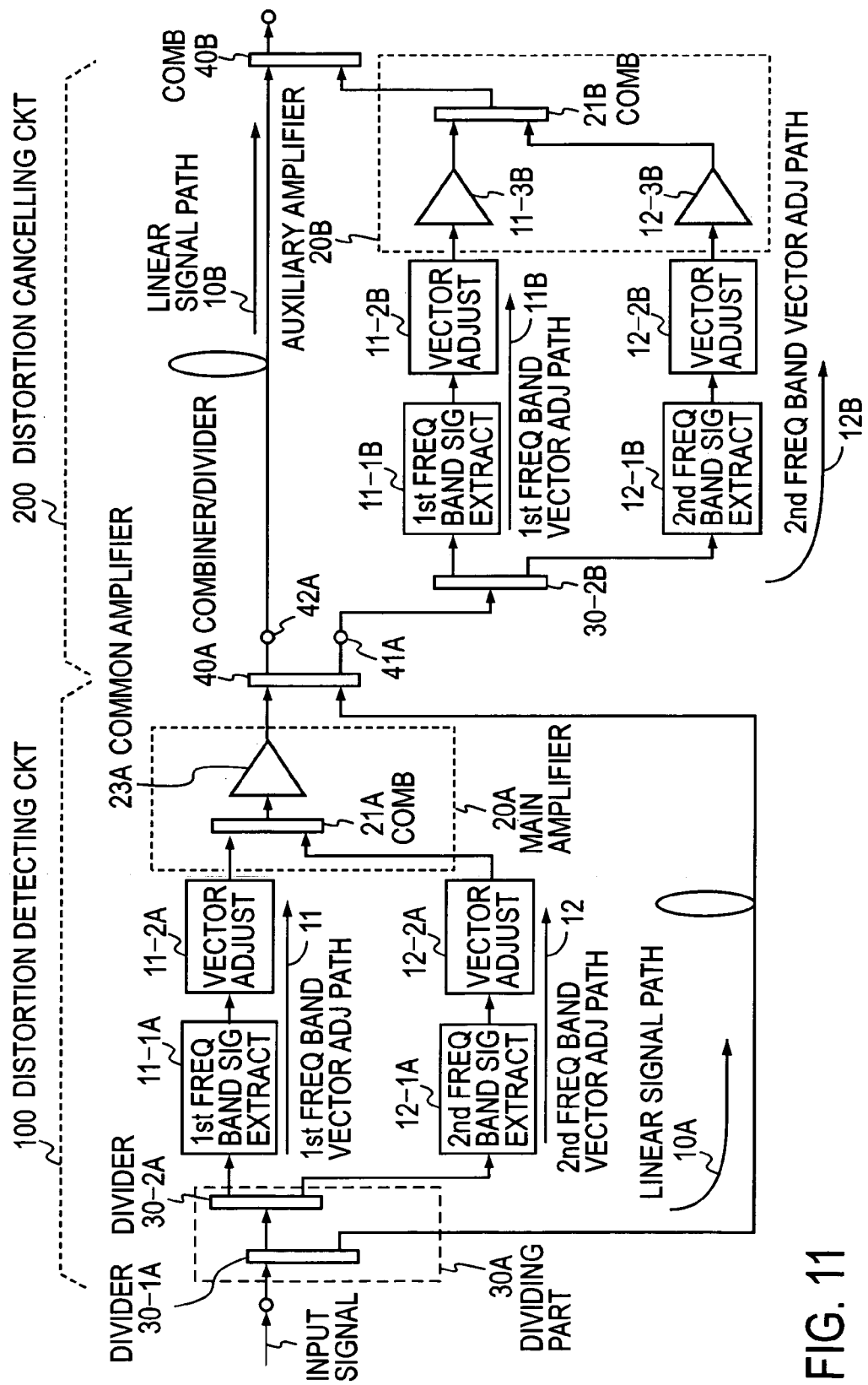
FIG. 11 is a block diagram for explaining another embodiment of the feed-forward amplifier of the present invention.

FIG. 11 illustrates in block form a third embodiment of the feed-forward amplifier according to the present invention. In this embodiment the multi-band signal processing circuit depicted in FIG. 7 is used as the distortion detecting circuit 100 in the FIG. 8 embodiment. The feed-forward amplifier of this embodiment also makes vector adjustment by use of the vector adjusters 11-2A, 11-2B and 12-2A, 12-2B for the respective frequency bands, and hence it permits compensation for distortion independently for each frequency band.

Since the main amplifier 20A of the distortion detecting circuit 100 is formed by a single common amplifier 23A that simultaneously amplifies signals of multiple frequency bands as the common amplifier 23 in FIG. 7, it is possible to achieve simplification of the device configuration and power savings from reduction in the number of amplifiers used.

Embodiment 4

Figure 12:
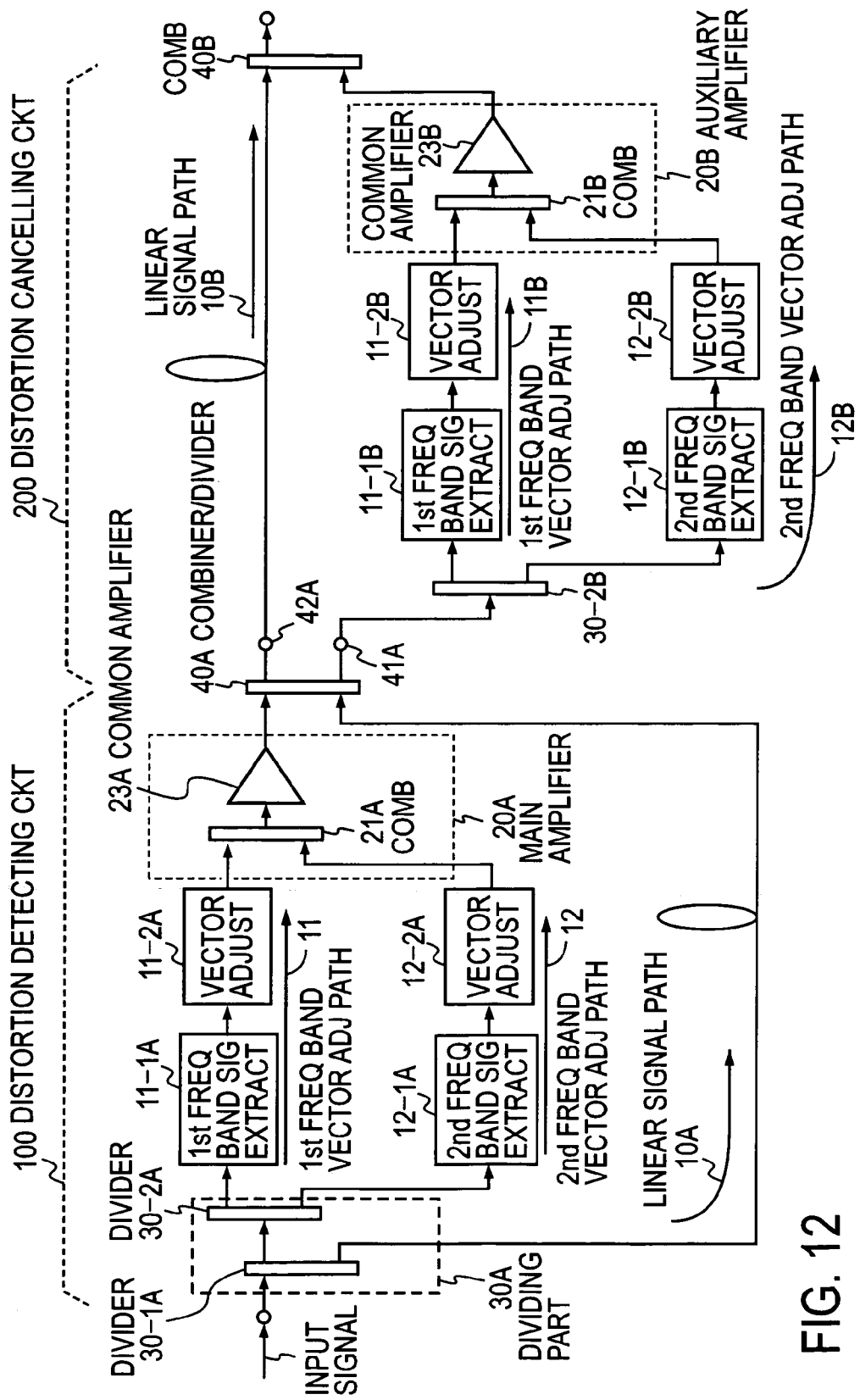
FIG. 12 is a block diagram for explaining another embodiment of the feed-forward amplifier of the present invention.

FIG. 12 illustrates in block form a fourth embodiment of the feed-forward amplifier according to the present invention. In this embodiment each of the distortion detecting circuit 100 and the distortion cancelling circuit 200 in the FIG. 8 embodiment is formed by the multi-band signal processing circuit depicted in FIG. 7.

The main amplifier 20A of the distortion detecting circuit 100 is formed by the common amplifier 23A that simultaneously amplifies signals of multiple frequency bands. The auxiliary amplifier 23B of the distortion cancelling circuit 200 is also formed by the common amplifier that simultaneously amplifies signals of multiple frequency bands. Since the main amplifier 20A and the auxiliary amplifier 20B are each formed by a single amplifier, it is possible to achieve simplification of the device configuration and power savings from not using multiple amplifiers.

Embodiment 5

Figure 13:
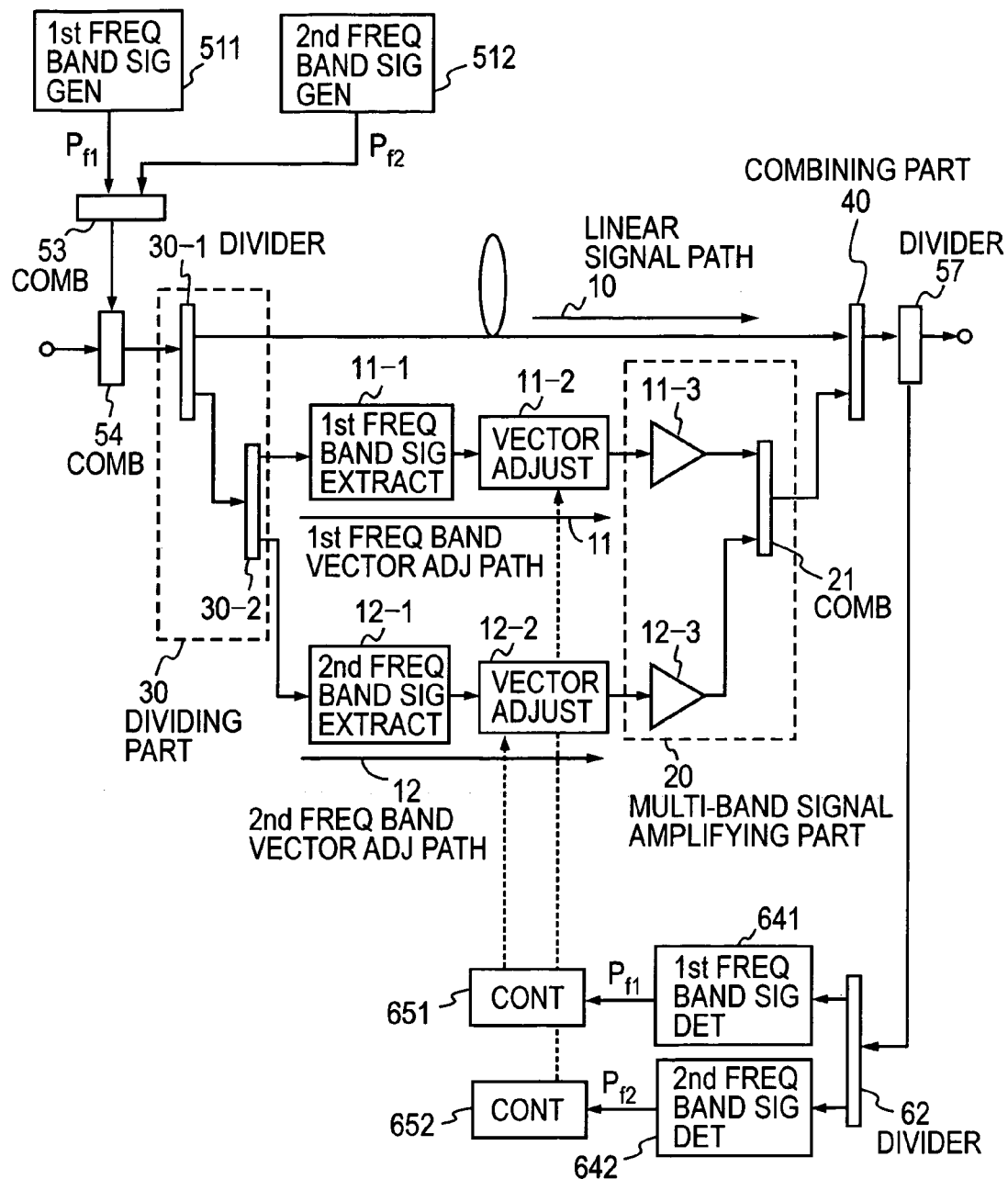
FIG. 13 is a block diagram for explaining an embodiment of a multi-band signal processing circuit applicable to the feed-forward amplifier of the present invention.

FIG. 13 illustrates in block form an embodiment of the multi-band signal processing circuit that permits automatic adjustment of the vector adjusters 11-2 and 12-2 in the multi-band signal processing circuit depicted in FIG. 6. The illustrated configuration is applicable to the distortion detecting circuit 100 and/or distortion cancelling circuit 200 in the feed-forward amplifiers of FIGS. 8, 10 and 11.

In the FIG. 13 embodiment there are provided, in addition to the FIG. 6 configuration: first and second frequency band signal generators 511 and 512 for generating pilot signals $P_{f1}$ and $P_{f2}$ of first and second frequency bands; a combiner 53 for combining the outputs of the first and second frequency band signal generators 511 and 512; a combiner 54 disposed at the input side of the dividing part 30; a divider 57 disposed at the output side of the combining part 40; a divider 62 for dividing the output from the divider 57 into two; two signal detectors 641 and 642 for detecting pilot signals $P_{f1}$ and $P_{f2}$ generated by the signal generators 511 and 512, respectively; and two controllers 651 and 652.

Assume that the input signal is composed of two waves of different frequency bands. In the vector adjustment path 11, the first frequency band signal extractor 11-1 extracts the first frequency band signal of the input signal and the vector adjuster 11-2 makes vector adjustment. Similarly, the second frequency band signal extractor 12-1 extracts the second frequency band signal and the vector adjuster 12-2 make vector adjustment. The combining part 40 combines signals fed thereto from the two vector adjusters 11-2 and 12-2 via the individual amplifiers 11-3 and 12-3 of the multi-band signal amplifying part 20 and the output signal from the linear signal path 10. The pilot signals $P_{f1}$ and $P_{f2}$ on the vector adjustment paths 11 and 12 are adjusted for each frequency band to be opposite in phase and equal in delay and in amplitude to the output pilot signals $P_{f1}$ and $P_{f1}$ from the linear signal path 10 to cancel the output pilot signals $P_{f1}$ and $P_{f2}$ at the output of the combining part 40.

The first and second frequency band signal generators 511 and 512 generates the pilot signals $P_{f1}$ and $P_{f2}$ in the first and second frequency bands, respectively. The pilot signals $P_{f1}$ and $P_{f2}$ are combined by the combiner 53, and the combined output is provided via the combiner 54 to the input of the multi-band signal processing circuit. At the output of the multi-band signal processing circuit, the pilot signals $P_{f1}$ and $P_{f2}$ of the first and second frequency bands are extracted by the divider 57. The pilot signals $P_{f1}$ and $P_{f2}$ thus extracted are divided by the divider 62 into two, which are input to the first frequency band signal detector 641 and the second frequency band signal detector 642, respectively.

The signal detectors 641 and 642 can each be formed by a level detector or correlator or coherent detector, depending on whether each of the pilot signals $P_{f1}$ and $P_{f2}$ is a pilot signal of a tone signal (CW signal) or a modulated pilot signal. In this way, the signal detectors 641 and 642 detect the pilot signals $P_{f1}$ and $P_{f2}$ of the respective frequency bands. The thus detected pilot signals $P_{f1}$ and $P_{f2}$ are applied to the controllers 651 and 652. The controllers 651 and 652 control the vector adjusters 11-2 and 12-2 to minimize the levels of the pilot signals fed thereto. The vector adjusters 11-2 and 12-2 are each formed by a variable attenuator for amplitude adjustment and a variable phase shifter for phase adjustment as with the case of the vector adjuster 101V in FIG. 1. The vector adjusters 11-2 and 12-2 of the vector adjustment paths 11 and 12 are controlled by the controllers 651 and 652 so that the signals on the vector adjustment paths 11 and 12 for the respective frequency bands and the signals on the linear signal path 10 become opposite in phase and equal in delay and in amplitude to each other at the input of the combining part 40.

The vector adjuster 11-2 for the first frequency band and the vector adjuster 12-2 for the second frequency band are controlled by the controllers 651 and 652 independently of each other to minimize the levels of the pilot signals $P_{f1}$ and $P_{f2}$. The controllers 651 and 652 control the vector adjusters 11-2 and 12-2 on the basis of the levels of the pilot signals $P_{f1}$ and $P_{f2}$ detected by the signal detectors 641 and 642, respectively. However, the vector adjusters 11-2 and 12-2 may also be controlled by the controllers 651 and 652 until a prescribed value of the out-band leakage power ratio of the radio system standard is reached. In practice, the controllers 651 and 652 need not to keep on controlling the vector adjusters 11-2 and 12-2 until the pilot signal levels become minimum, that is, the control may be stopped when the detected pilot signal levels go down below a predetermined level. This goes for all the multi-band signal processing circuits described below.

Embodiment 6

Figure 14:
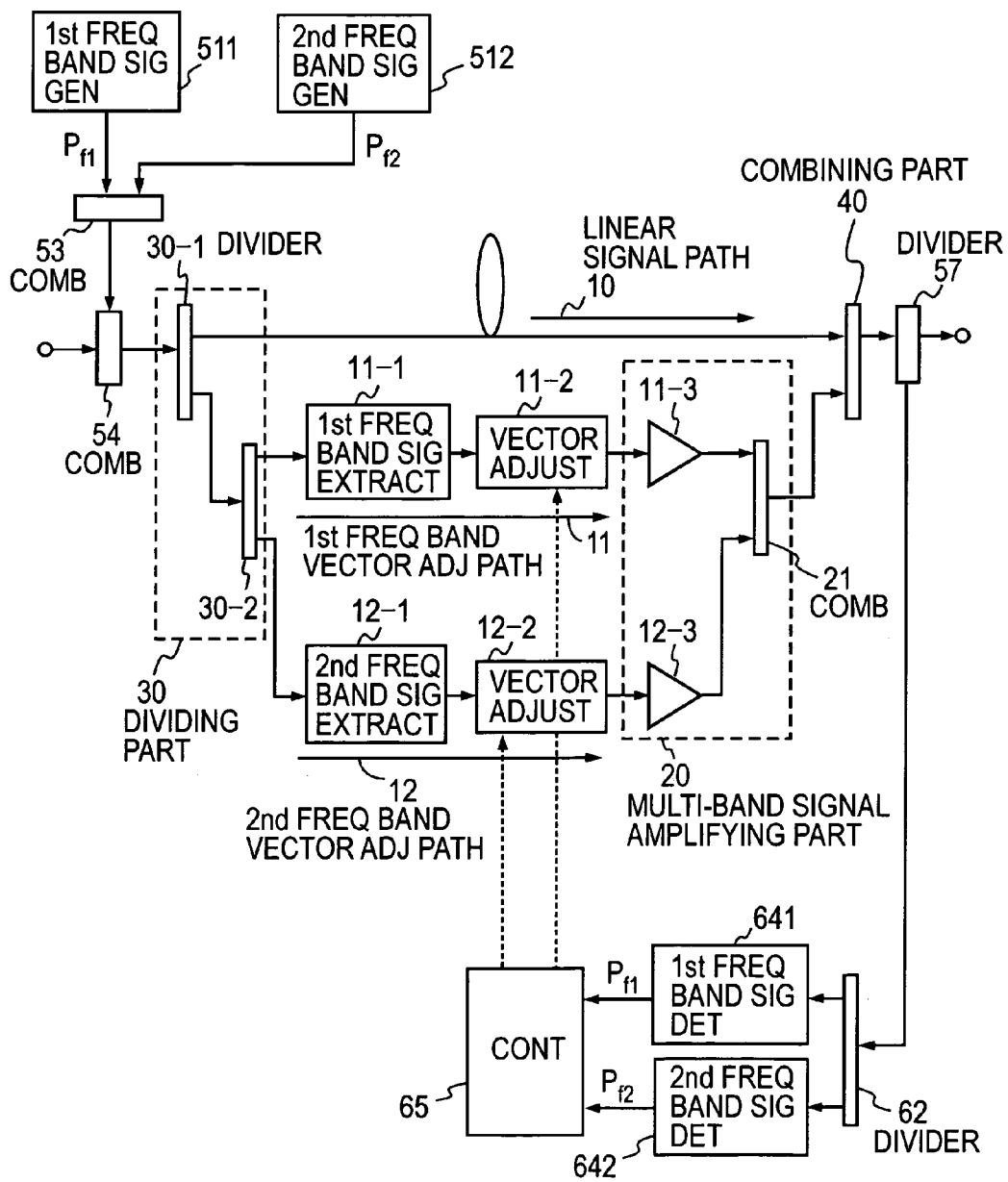
FIG. 14 is a block diagram for explaining another embodiment of the multi-band signal processing circuit applicable to the feed-forward amplifier of the present invention.

FIG. 14 illustrates in block form an embodiment of the multi-band signal processing circuit that is applicable to the distortion detecting circuit 100 and/or distortion cancelling circuit 200 in the feed-forward amplifiers shown in FIGS. 8, 10 and 11. This embodiment is a modified form of the FIG. 13 embodiment, in which the two controllers 651 and 652 are integrated into one controller 65.

The pilot signals $P_{f1}$ and $P_{f2}$ detected by the signal detectors 641 and 642 are input to the common controller 65. The controller 65 controls the first frequency band vector adjuster 11-2 to minimize the level of the pilot signal $P_{f1}$ detected by the first frequency band signal detector 641. Then, the controller 65 controls the second frequency band vector adjuster 12-2 to minimize the level of the pilot signal $P_{f2}$ detected by the second frequency band signal detector 642. In general, the control of the second frequency band vector adjuster 12-2 affects the level of the first frequency band pilot signal $P_{f1}$ adjusted by the first frequency band vector adjuster 11-2. This influence depends on the isolation between the first frequency band vector adjustment path 11 and the second frequency band vector adjustment path 12. On this account, the controller 65 controls again the first frequency band vector adjuster 11-2 to minimize the level of the pilot signal $P_{f1}$ injected into the first frequency band. In this way, the first frequency band vector adjuster 11-2 and the second frequency band vector adjuster 12-2 are alternately controlled by the controller 54. As a result, the level of the pilot signals $P_{f1}$ and $P_{f2}$ injected into the first and second frequency bands, respectively, are minimized. The first frequency band vector adjuster 11-2 and the second frequency band vector adjuster 12-2 may also be simultaneously controlled by the controller 65 to minimize the levels of the respective pilot signals.

Embodiment 7

Figure 15:
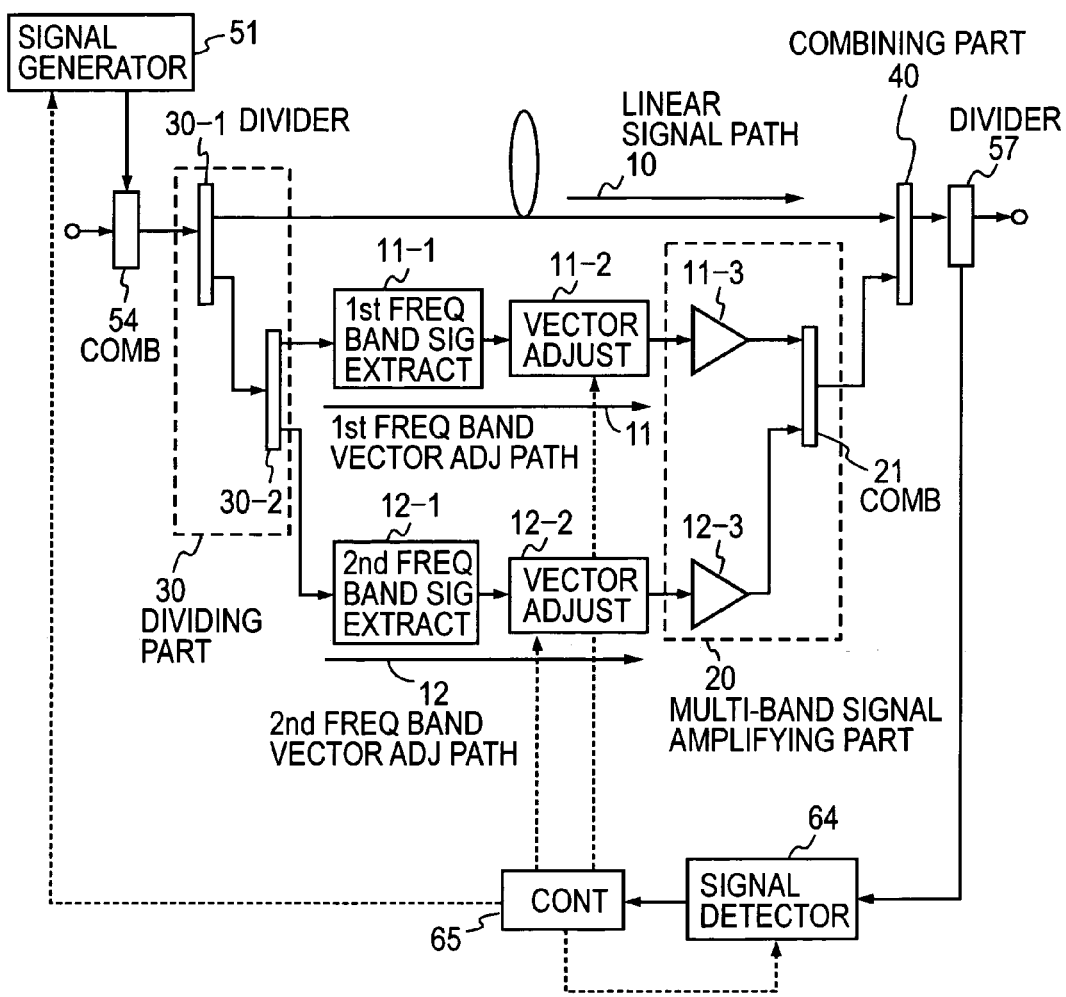
FIG. 15 is a block diagram for explaining another embodiment of the multi-band signal processing circuit applicable to the feed-forward amplifier of the present invention.

FIG. 15 illustrates in block form another embodiment of the multi-band signal processing circuit that is applicable to the distortion detecting circuit 100 and/or distortion cancelling circuit 200 in the feed-forward amplifiers shown in FIGS. 8, 10 and 11. This embodiment is a modified form of the FIG. 14 embodiment, in which the two signal generators 511 and 512 and the combiner 53 are replaced with one signal generator 51, and the divider 62 and the two signal detectors 641 and 642 are replaced with one signal detector 64.

The signal generator 51 responds to an instruction from the controller 65 to generate the pilot signal $P_{f1}$ in the first frequency band. The pilot signal $P_{f1}$ thus generated is injected via the combiner 54 into the input to the multi-band signal processing circuit. At the output of the multi-band signal processing circuit the first frequency band pilot signal $P_{f1}$ is extracted by the divider 57. The pilot signal $P_{f1}$ thus extracted is input to the signal detector 64. As is the case with the embodiments described above, the signal detector 64 can be formed by a level detector or correlator or coherent detector, depending on whether the pilot signal $P_{f1}$ is a CW pilot signal or a modulated signal.

In this way, the signal detector 64 detects the first frequency band pilot signal $P_{f1}$, which is provided to the controller 65. The controller 65 controls the first frequency band vector adjuster 11-2 to minimize the level of the pilot signal $P_{f1}$ fed thereto.

After adjustment of the first frequency band vector adjuster 11-2 the controller 65 instructs the signal generator 51 to generate the second frequency band pilot signal $P_{f2}$. As is the case with the first frequency band vector adjuster 11-2, the controller 65 controls the second frequency band vector adjuster 12-2 to minimize the level of the second frequency band pilot signal $P_{f2}$ detected by the signal detector 64. The first and second frequency band vector adjusters 11-2 and 12-2 are alternately controlled by the controller 65 to minimize the levels of the pilot signals $P_{f1}$ and $P_{f2}$ detected at different moment in time.

Embodiment 8

Figure 16:
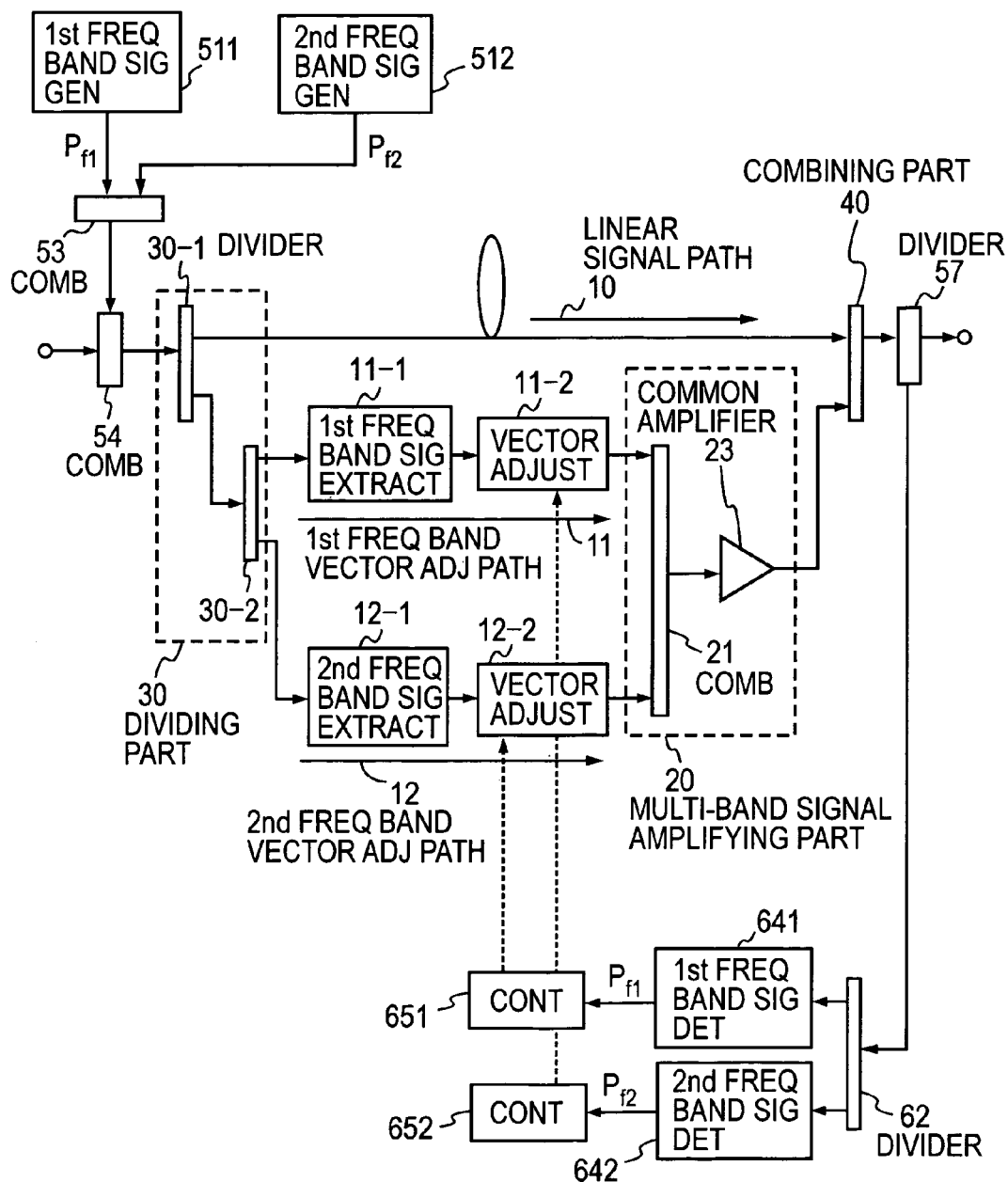
FIG. 16 is a block diagram for explaining another embodiment of the multi-band signal processing circuit applicable to the feed-forward amplifier of the present invention.

FIG. 16 illustrates in block form another embodiment of the multi-band signal processing circuit that is applicable to the distortion detecting circuit 100 and/or distortion cancelling circuit 200 in the feed-forward amplifiers of FIGS. 10, 11, and 12. This embodiment is a modified form of the FIG. 13 embodiment, in which the multi-band signal amplifying part 20 is composed of the combiner 21 and the common amplifier 23 as in the case of FIG. 7. Since the multi-band signal amplifying part 20 uses the common amplifier 23, a mutual dependence is likely to develop in vector adjustment between the first and second frequency bands. To avoid this, the two controllers 651 and 652 alternately control the vector adjusters 11-2 and 12-2 to minimize the levels of the pilot signals $P_{f1}$ and $P_{f2}$ which are referred to by the respective controllers. This embodiment is identical in construction and operation with the FIG. 13 embodiment except the above, and therefore no further description will be given.

Embodiment 9

Figure 17:
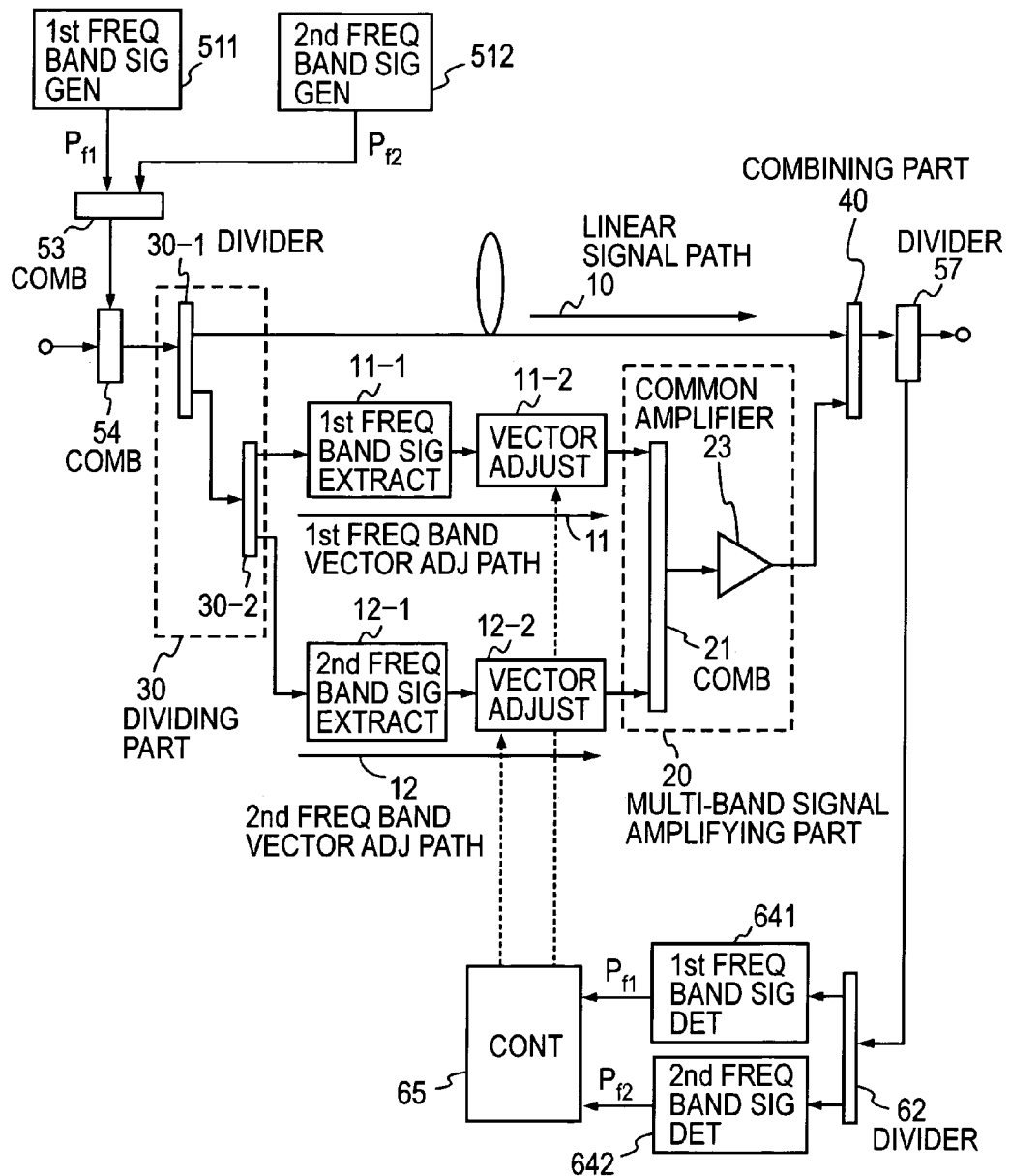
FIG. 17 is a block diagram for explaining another embodiment of the multi-band signal processing circuit applicable to the feed-forward amplifier of the present invention.

FIG. 17 illustrates in block form another embodiment of the multi-band signal processing circuit that is applicable to the distortion detecting circuit 100 and/or distortion cancelling circuit 200 in the feed-forward amplifiers of FIGS. 10, 11, and 12. This embodiment is a modified form of the FIG. 16 embodiment, in which the two controllers 651 and 652 are integrated into one controller 65. The first and second frequency band vector adjusters 11-2 and 12-2 are alternately controlled by the controller 65 to minimize the levels of the pilot signals $P_{f1}$ and $P_{f2}$ detected by the signal detectors 641 and 642, respectively. This embodiment is identical in construction and operation with the FIG. 16 embodiment except the above, and therefore no further description will be given. The first frequency band vector adjuster 11-2 and the second frequency band vector adjuster 12-2 may also be simultaneously controlled by the controller 65 to minimize the levels of the respective pilot signals.

Embodiment 10

Figure 18:
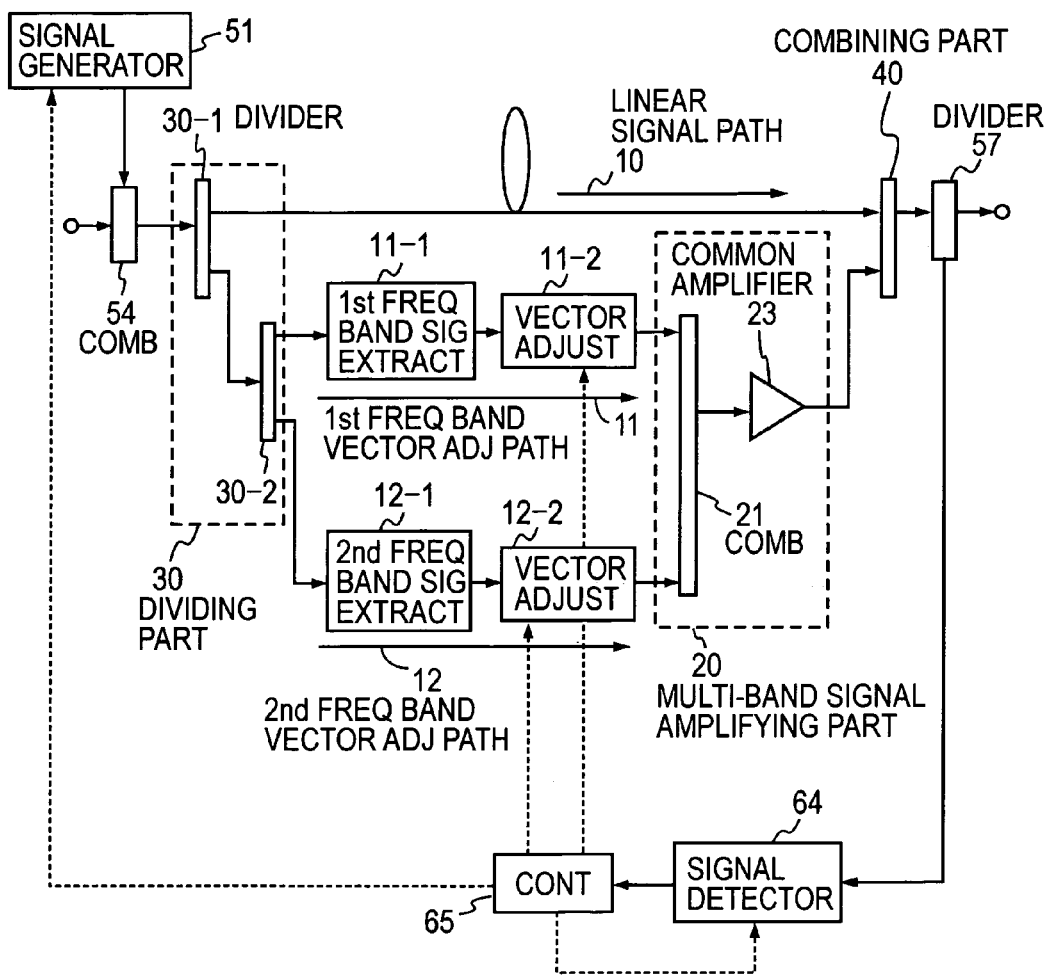
FIG. 18 is a block diagram for explaining another embodiment of the multi-band signal processing circuit applicable to the feed-forward amplifier of the present invention.

FIG. 18 illustrates in block form another embodiment of the multi-band signal processing circuit that is applicable to the distortion detecting circuit 100 and/or distortion cancelling circuit 200 in the feed-forward amplifiers of FIGS. 10, 11, and 12. This embodiment is a modified form of the FIG. 15 embodiment, in which the two individual amplifiers 11-3 and 12-3 and the combiner 21 in the multi-band signal amplifying part 20 are replaces with the combiner 21 for combining the outputs from the first and second frequency band vector adjustment paths 11 and 12 and the common amplifier 23 for amplifying the combined output. This embodiment is identical in construction and operation with the FIG. 15 embodiment except the above, and therefore no further description will be given.

Embodiment 11

Figure 19:
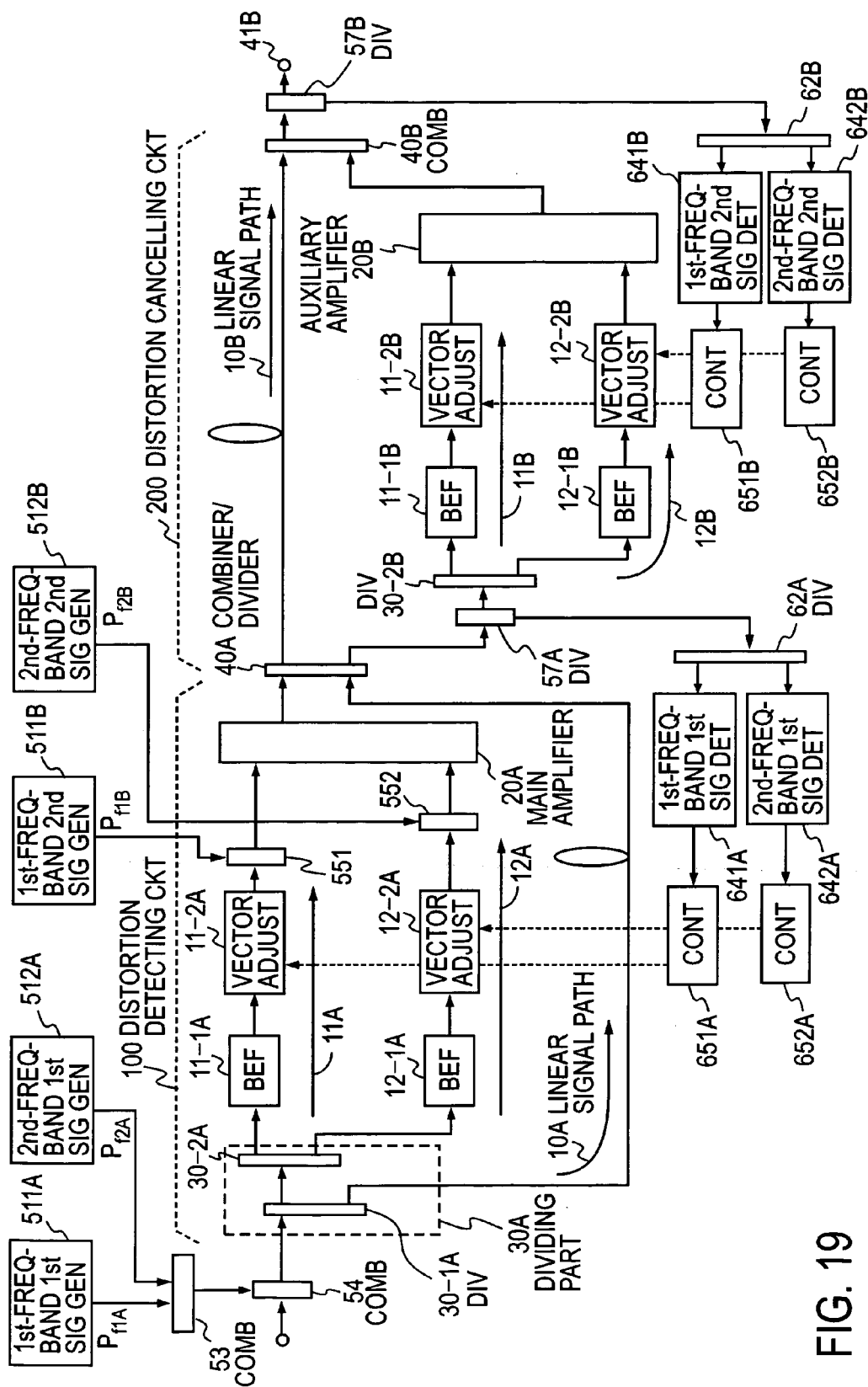
FIG. 19 is a block diagram for explaining another embodiment of the feed-forward amplifier according to the present invention.

FIG. 19 illustrates in block form another embodiment of the feed-forward amplifier according to the present invention. This embodiment has a functional configuration for automatic control of the vector adjusters 11-2A, 12-2A and 11-2B, 12-2B in any of the feed-forward amplifiers depicted in FIGS. 8, 10, 11 and 12. Accordingly, either of the main amplifier 20A and the auxiliary amplifier 20B may be formed by multiple individual amplifiers corresponding to the frequency bands used, or by a single common amplifier. In this and subsequent embodiments are described to use the frequency band signal extractors 11-1A, 12-1A and 11-1B, 12-1B each formed by a BEF, but a BPF may also be used.

This embodiment is provided with first- and second-frequency-band first signal generators 511A and 512A for generating first and second frequency band pilot signals $P_{f1A}$ and $P_{f2A}$ that are used to control the two vector adjusters 11-2A and 12-2A of the distortion detecting circuit 100. The output signals from the first- and second-frequency-band first signal generators 511A and 512A are combined by the combiner 57, and the combined output is injected into the distortion detecting circuit 100 via the combiner 54 provided at the input side thereof.

A divider 57A is disposed at the input side of the divider 30-2B to divide the difference component signal provided to the distortion injection path of the distortion cancelling circuit 200. Furthermore, there are provided: a divider 62A for further dividing one of the divided outputs from the divider 57 into two signals; first- and second-frequency-band first signal detectors 641A and 642A which are supplied with the two divided signals to detect the first- and second-frequency-band first pilot signals $P_{f1A}$ and $P_{f2A}$, respectively; and controllers 651A and 652A for controlling the first and second frequency band vector adjusters 11-2A and 12-2A on the basis of the detected pilot signals $P_{f1A}$ and $P_{f2A}$, respectively.

Similarly, there are provided first- and second-frequency-band second signal generators 511B and 512B for generating first and second frequency band pilot signals $P_{f1B}$ and $P_{f2B}$ that are used to control the two vector adjusters 11-2B and 112-2B of the distortion cancelling circuit 200, respectively. The output pilot signals $P_{f1B}$ and $P_{f2B}$ from the first- and second-frequency-band second signal generators 511B and 512B are injected via combiners 551 and 552 into respective frequency band inputs of the main amplifier 20A. The one of the divided signals by a divider 57B at the output side of the combiner 40B is further divided by a divider 62B into two and applied to first- and second-frequency-band second signal detectors 641B and 642B, by which the first and second frequency band pilot signals $P_{f1B}$ and $P_{f2B}$ are detected. On the basis of the thus detected pilot signals $P_{f1B}$ and $P_{f2B}$, controllers 651B and 652B control the vector adjusters 11-2B and 12-2B of the distortion cancelling circuit 200.

The first and second frequency band pilot signals $P_{f1A}$ and $P_{f2A}$ generated by the first- and second-frequency-band first signal generators 511A and 512A are combined by the combiner 53, then the combined output is further combined by the combiner 54 with the input signal, and the combined output is input to the distortion detecting circuit 100. At the output side of the distortion detecting circuit 100 the difference component is divided by the divider 57A and applied to the divider 30-2B and the divider 62A, the latter of which further divides the difference component into two and provides them to the first- and second-frequency-band first signal detectors 641A and 642A, respectively. The signal detectors 641A and 642A can be formed by level detectors or correlator or coherent detectors, depending on whether the pilot signals $P_{f1A}$ and $P_{f2A}$ are CW pilot signals or modulated pilot signals. Thus the signal detectors 641A and 542A detect the pilot signals $P_{f1A}$ and $P_{f2A}$ of the respective frequency bands, which are input to the controllers 651A and 652A, respectively.

The controllers 651A and 652A controls the vector adjusters 11-2A and 12-2A to minimize the levels of the pilot signals $P_{f1A}$ and $P_{f2A}$ detected as described above. Each vector adjuster is formed by a variable attenuator and a variable phase shifter. The vector adjusters 11-2A and 12-2A of the respective vector adjustment paths 11A and 12A are controlled by the controllers 651A and 652A to minimize the levels of the pilot signals $P_{f1A}$ and $P_{f2A}$, by which the signal from the linear signal path 10 and the signals from the vector adjustment paths 11A and 12A are adjusted so that they become opposite in phase and equal in delay and in amplitude to each other at the input of the combiner/divider 40A. In practice, the controllers 651A and 652A do not control the vector adjusters to minimize the levels of the pilot signals, but instead they need only to make adjustments such that the pilot signals go down below a predetermined level. The controllers 651A and 652A controls the vector adjusters 11-2A and 12-2A by referring to the levels of the pilot signals detected by the signal detectors 641A and 642A. They may control the vector adjusters until a prescribed value of the out-band leakage power ratio of the radio system is reached. The same goes for all the embodiments described hereinafter.

Similarly, the pilot signals $P_{f1B}$ and $P_{f2B}$ injected into the vector adjustment paths 11A and 12A from the first- and second-frequency-band second signal generators 511B and 512B are provided via the main amplifier 20A to the combiner/divider 40A, from which they are fed to the linear signal path 10B and the distortion injection path (vector adjustment paths 11B and 12B) of the distortion cancelling circuit 200. The pilot signals $P_{f1B}$ and $P_{f2B}$ having passed through these paths 11B and 12B are combined by the combiner 40B. The combined output signal is divided by the divider 57B into two, one of which is provided to the divider 62B, from which it is applied to the first- and second-frequency-band second signal detectors 641B and 542B to thereby detect the pilot signals $P_{f1B}$ and $P_{f2B}$, respectively. The pilot signals $P_{f1B}$ and $P_{f2B}$ thus detected are applied to the controllers 651B and 652B, which control the vector adjusters 11-2B and 12-2B to minimize the levels of the detected pilot signals $P_{f1B}$ and $P_{f2B}$.

The controller 651A, which controls the vector adjuster 11-2A in the distortion detecting circuit 100 to minimize the level of the pilot signal $P_{f1A}$ detected by the first-frequency-band first signal detector 651A, and the controller 652A, which controls the vector adjuster 12-2A to minimize the level of the pilot signal $P_{f2A}$ detected by the second-frequency-band signal detector 642A, are independent of each other. With a high degree of isolation provided between the first and second frequency band vector adjustment paths 11A and 12A, it is possible to simultaneously control the vector adjusters 11-2A and 12-2A in one operation by the two pilot signals $P_{f1A}$ and $P_{f2A}$, respectively. With a low degree of isolation, however, since the adjustment of the one of the vector adjusters affects the adjustment of the other, they need to be adjusted alternately two or more times.

Similarly, when the degree of isolation between the vector adjustment paths 11B and 12B is high in the distortion cancelling circuit 200, the vector adjusters 11-2B and 12-2B can be simultaneously controlled by the two controllers 651B and 652B independently of each other, but if the degree of isolation is low, they are alternately controlled two or more times. In this way, the feed-forward amplifier can be adjusted automatically.

Embodiment 12

Figure 20:
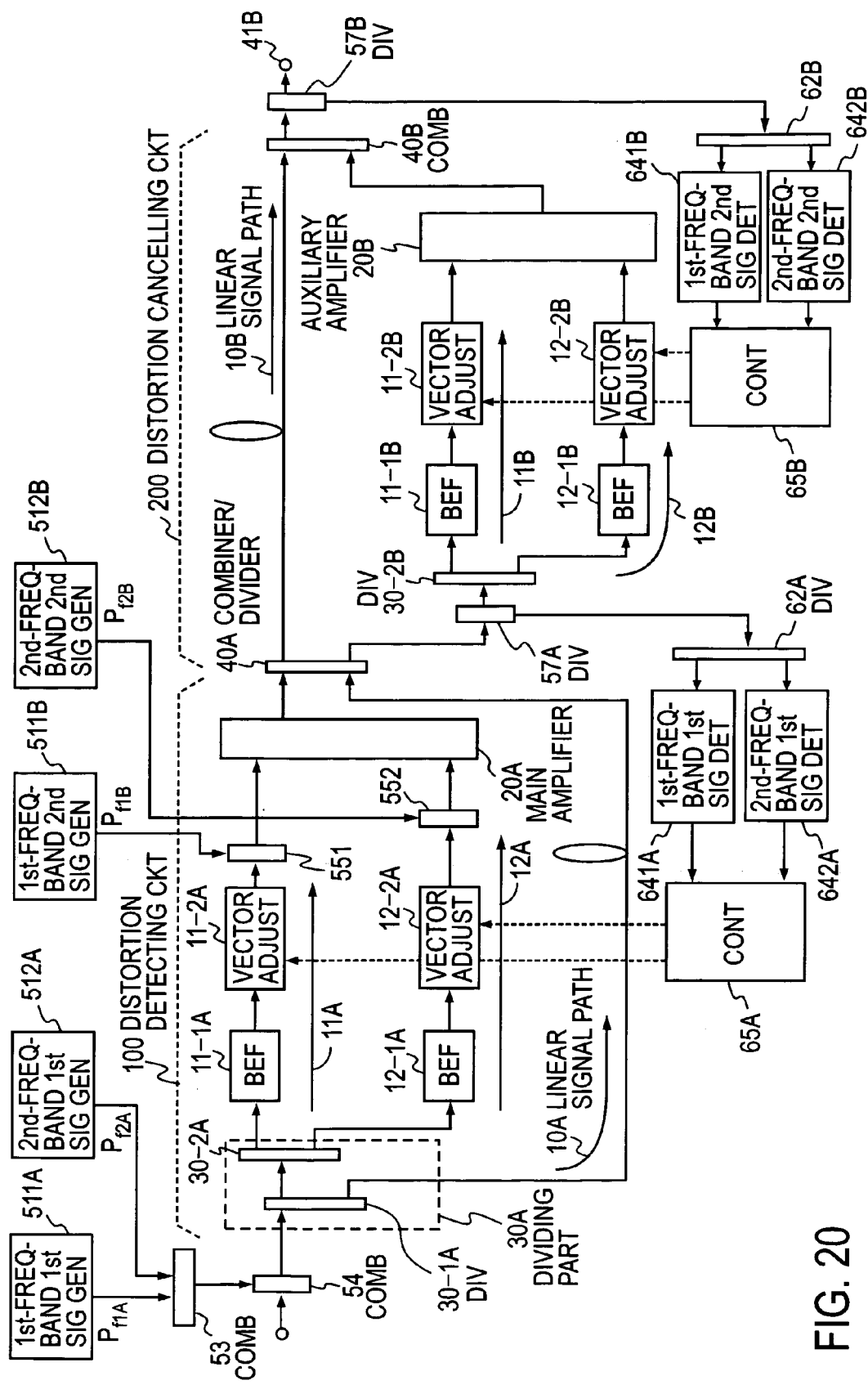
FIG. 20 is a block diagram for explaining another embodiment of the feed-forward amplifier according to the present invention.

FIG. 20 illustrates in block form another embodiment of the feed-forward amplifier according to the present invention. This embodiment is a modified form of the FIG. 19 embodiment, which uses one controller 65A as a substitute for the two controllers 651A and 652A for controlling the two vector adjusters 11-2A and 12-2A in the distortion detecting circuit 100 and one controller 65B as a substitute for the two controllers 651B and 652B for controlling the two vector adjusters 11-2B and 12-2B in the distortion cancelling circuit 200. This embodiment is identical in construction with the FIG. 19 except the above. Accordingly, the controller 65A is supplied with the detected pilot signals $P_{f1A}$ and $P_{f2A}$, and controls the vector adjusters 11-2A and 12-2A to minimize the levels of the detected pilot signals. Similarly, the controller 65B is supplied with the detected pilot signals $P_{f1B}$ and $P_{f2B}$, and controls the vector adjusters 11-2B and 12-2B to minimize the levels of the detected pilot signals.

Embodiment 13

Figure 21:
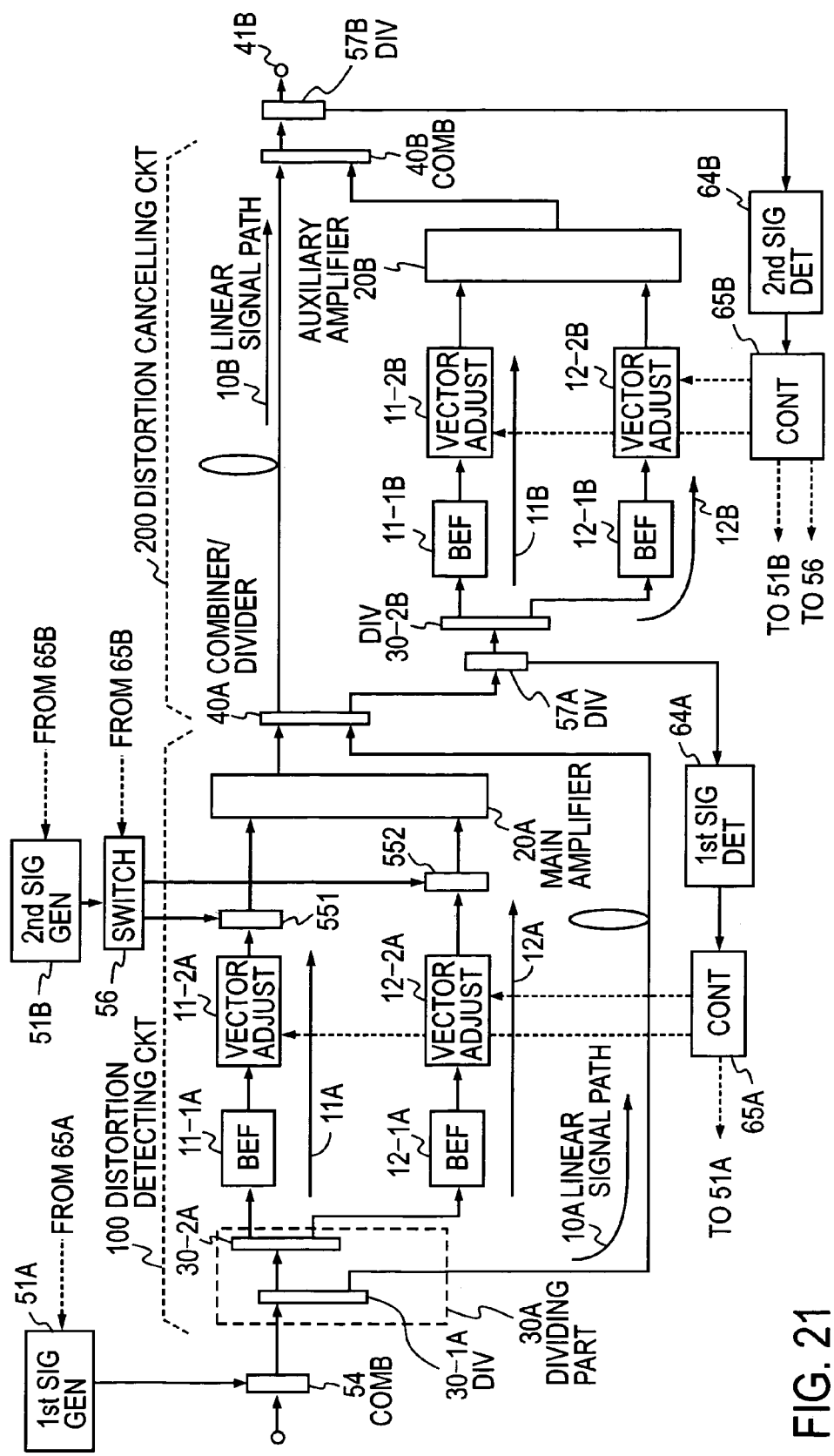
FIG. 21 is a block diagram for explaining another embodiment of the feed-forward amplifier according to the present invention.

FIG. 21 illustrates in block form another embodiment of the feed-forward amplifier according to the present invention. This embodiment is a modified form of the FIG. 19 embodiment, in which the first and second frequency band pilot signals $P_{f1A}$ and $P_{f2A}$ are alternately generated by one first signal generator 51A in place of the two first signal generators 511A and 512A and the first and second frequency band pilot signals $P_{f1B}$ and $P_{f2B}$ are alternately generated by one second signal generator 51B and a switch 56 in place of the two second signal generators 511B and 512B. Accordingly, the divider 62A, the two first signal detectors 641A, 642A and the two controllers 651A, 652A in FIG. 19 are replaced with one first signal detector 64A and one controller 65A, and the divider 62B, the two second signal detectors 641B, 642B and the two controllers 651B, 652B are replaced with one second signal detector 64B and one controller 65B.

In the case of controlling the first frequency band vector adjuster 11-2A in the distortion detecting circuit 100, the controller 65A controls the first signal generator 51A to generate the first frequency band pilot signal $P_{f1A}$ and controls the vector adjuster 11-2A to minimize the level of the pilot signal $P_{f1A}$ that is detected by the first signal detector 64A. In the case of controlling the second frequency band vector adjuster 12-2A, the controller 65A controls the first signal generator 51A to generate the second frequency band pilot signal $P_{f2A}$ and controls the vector adjuster 12-2A to minimize the level of the pilot signal $P_{f2A}$ that is detected by the first signal detector 64A.

When the degree of isolation between the first and second frequency band vector adjustment paths 11A and 12A is low, the first and second frequency band vector adjusters 11-2A and 12-2A are alternately adjusted twice or more times since the adjustment of the vector adjuster in one of the two vector adjustment path causes a change in the optimum adjustment value for the vector adjuster in the other vector adjustment path.

Similarly, in the case of adjusting the first frequency band vector adjuster 11-2B in the distortion cancelling circuit 200, the controller 65B causes the second signal generator 51B to generate the first frequency band pilot signal $P_{f1B}$, then controls the switch 56 to pass therethrough the pilot signal $P_{f1B}$ to the combiner 551, and adjusts the vector adjuster 11-2B to minimize the level of the pilot signal $P_{f1B}$ that is detected by the second signal detector 64B. In the case of adjusting the second frequency band vector adjuster 12-2B, the controller 65B causes the second signal generator 51B to generate the second frequency band pilot signal $P_{f2B}$. Then the controller 65B controls the switch 56 to pass therethrough the pilot signal $P_{f2B}$ to the combiner 552, and adjusts the vector adjuster 12-2B to minimize the level of the pilot signal $P_{f2B}$ that is detected by the second signal detector 64B. In the distortion cancelling circuit 200, too, when the degree of isolation between the first and second frequency band vector adjustment paths 11B and 12B is low, the vector adjusters 11-2B and 12-2B are alternately adjusted twice or more times.

As regards the control configuration for the vector adjusters and the pilot signal generators of the feed-forward amplifier, the configurations used in Embodiments 11, 12 and 13 may be applied, in combination, to the distortion detecting circuit and the distortion cancelling circuit. For example, the configurations in Embodiments 11 and 12 can be used for the distortion cancelling circuit and the distortion detecting circuit, respectively. With the combined use of the control configurations, as desired, for the distortion detecting circuit and the distortion cancelling circuit in Embodiments 11 to 13, it is possible to optimize the control configurations in accordance with balance adjusting characteristics of the distortion detecting circuit and the distortion cancelling circuit. This provides flexibility to the configuration of the feed-forward amplifier.

Embodiment 14

Figure 22:
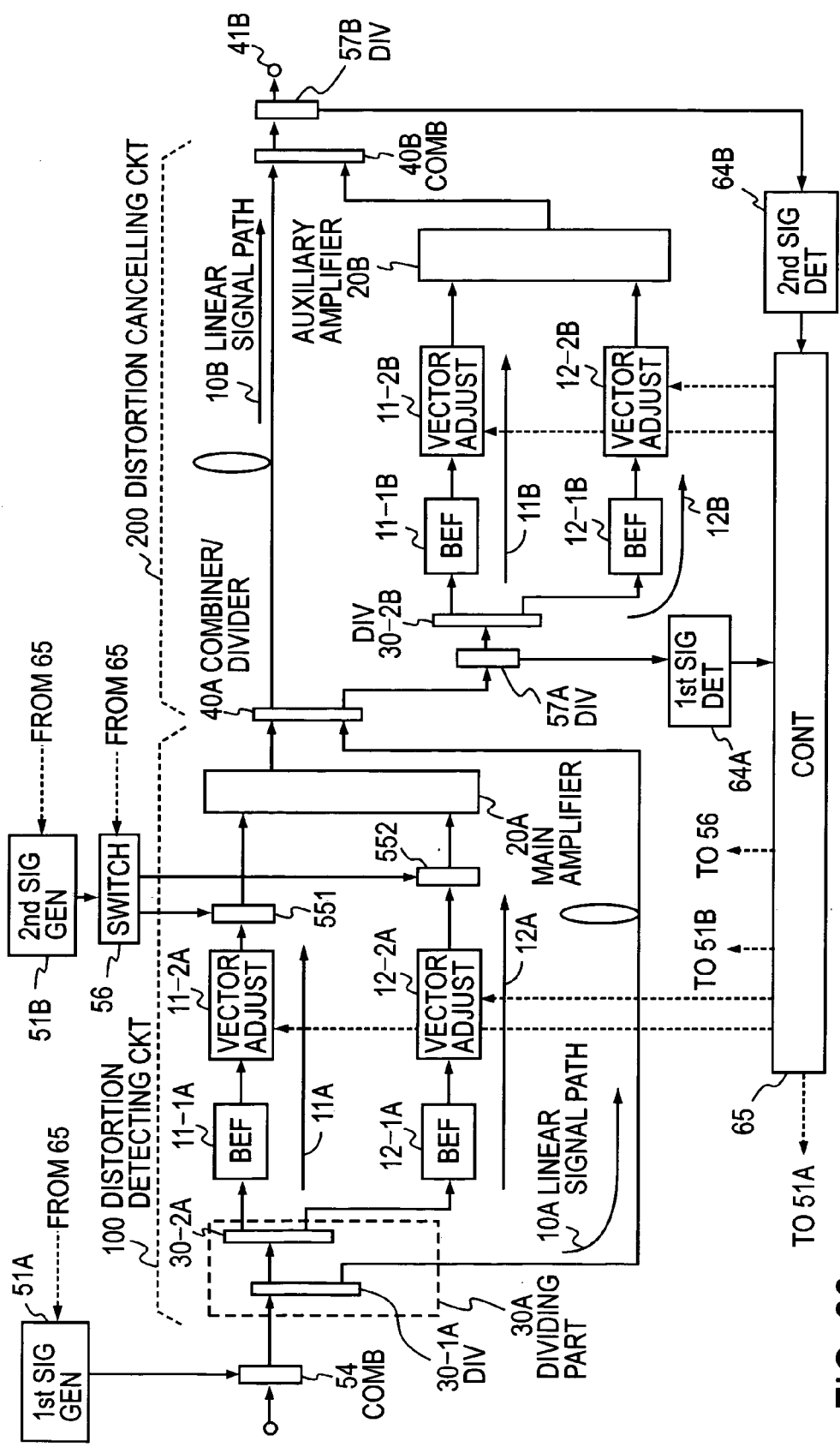
FIG. 22 is a block diagram for explaining another embodiment of the feed-forward amplifier according to the present invention.

FIG. 22 illustrates in block form another embodiment of the feed-forward amplifier according to the present invention. This embodiment is a modified form of the FIG. 21 embodiment, in which the common controller 65A for the distortion detecting circuit 100 and the common controller 65B for the distortion cancelling circuit 200 are integrated into one controller 65. The common controller 65 in this embodiment controls the first signal generator 51A, the second signal generator 51B, the switch 56, the vector adjusters 11-2A and 12-2A of the distortion detecting circuit 100, and the vector adjusters 11-2B and 12-2B of the distortion cancelling circuit 200.

The common controller 65 controls: the first signal generator 51A to generate the first frequency band pilot signal $P_{f1A}$; the second signal generator 51B to generate the first frequency band pilot signal $P_{f1B}$; and the switch 56 to inject therethrough the pilot signal $P_{f1B}$ into the first frequency band vector adjustment path 11A. The first signal detector 64A and the second signal detector 64B detect the first frequency band pilot signals $P_{f1A}$ and $P_{f1B}$ in the distortion detecting circuit 100 and the distortion cancelling circuit 200, respectively. The common controller 65 uses the thus detected two pilot signals $P_{f1A}$ and $P_{f1B}$ as reference signals, and simultaneously controls the first frequency band vector adjuster 11-2A of the distortion detecting circuit 100 and the first frequency band vector adjuster 11-2B of the distortion cancelling circuit 200 in such a manner as to minimize the levels of the two pilot signals $P_{f1A}$ and $P_{f1B}$. This provides increased adjustment speed.

After completion of the adjustment of the vector adjusters 11-2A and 11-2B by use of the first frequency band pilot signals $P_{f1A}$ and $P_{f1B}$, the common controller 65 controls: the first signal generator 51A to generate the second frequency band pilot signal $P_{f2A}$; the second signal generator 51B to generate the second frequency band pilot signal $P_{f2B}$; and the switch 56 to inject therethrough the pilot signal $P_{f2B}$ into the second frequency band vector adjustment path 12A. The first signal detector 64A and the second signal detector 64B detect the second frequency band pilot signals $P_{f2A}$ and $P_{f2B}$ in the distortion detecting circuit 100 and the distortion cancelling circuit 200, respectively. The common controller 65 uses the thus detected two pilot signals $P_{f2A}$ and $P_{f2B}$ as reference signals, and simultaneously controls the second frequency band vector adjuster 12-2A of the distortion detecting circuit 100 and the first frequency band vector adjuster 12-2B of the distortion cancelling circuit 200 in such a manner as to minimize the levels of the two pilot signals $P_{f2A}$ and $P_{f2B}$. This provides increased adjustment speed.

When the degrees of isolation between the first and second frequency band vector adjustment paths 11A and 12A and between the first and second frequency band vector adjustment paths 11B and 12B are low, control of the adjustment values of the second frequency band vector adjusters 12-2A and 12-2B causes changes in the optimum adjustment values of the first frequency band vector adjusters 11-2A and 11-2B adjusted earlier. In such an instance, the common controller 65 alternately repeats the control by the first frequency band pilot signals $P_{f1A}$ and $P_{f1B}$ and the control by the second frequency band pilot signals $P_{f2A}$ and $P_{f2B}$, thereby optimizing the adjustment of the first and second frequency band vector adjusters 11-2A, 11-2B an 12-2A, 12-2B.

As described previously, in the embodiments of FIGS. 19 to 22 the main amplifier 20A and the auxiliary amplifier 20B may each be formed by individual amplifiers corresponding to the respective frequency bands used, or by one common amplifier. Where the main amplifier 20A and the auxiliary amplifier 20B are each formed by one common amplifier, amplification of signals of different two frequency bands by the same amplifier provides a lower degree of isolation between the vector adjustment paths of different frequency bands and hence creates a possibility of the interdependence of vector adjustment between the vector adjustment paths, and for this reason it is preferable to alternate the vector adjustment between the first and second frequency bands in the distortion detecting circuit 100 and the distortion cancelling circuit 200.

Besides, the controller 65 may also be adapted to respond to the pilot signals from the first and second signal detectors 64A and 64B and to simultaneously control the vector adjusters 11-2A, 12-2A and 11-2B, 12-2B in such a manner as to minimize the levels of the two pilot signals. With this control scheme, it is possible to increase the transmission output from the feed-forward amplifier while holding its distortion component smaller than a certain value.

Embodiment 15

Figure 23:
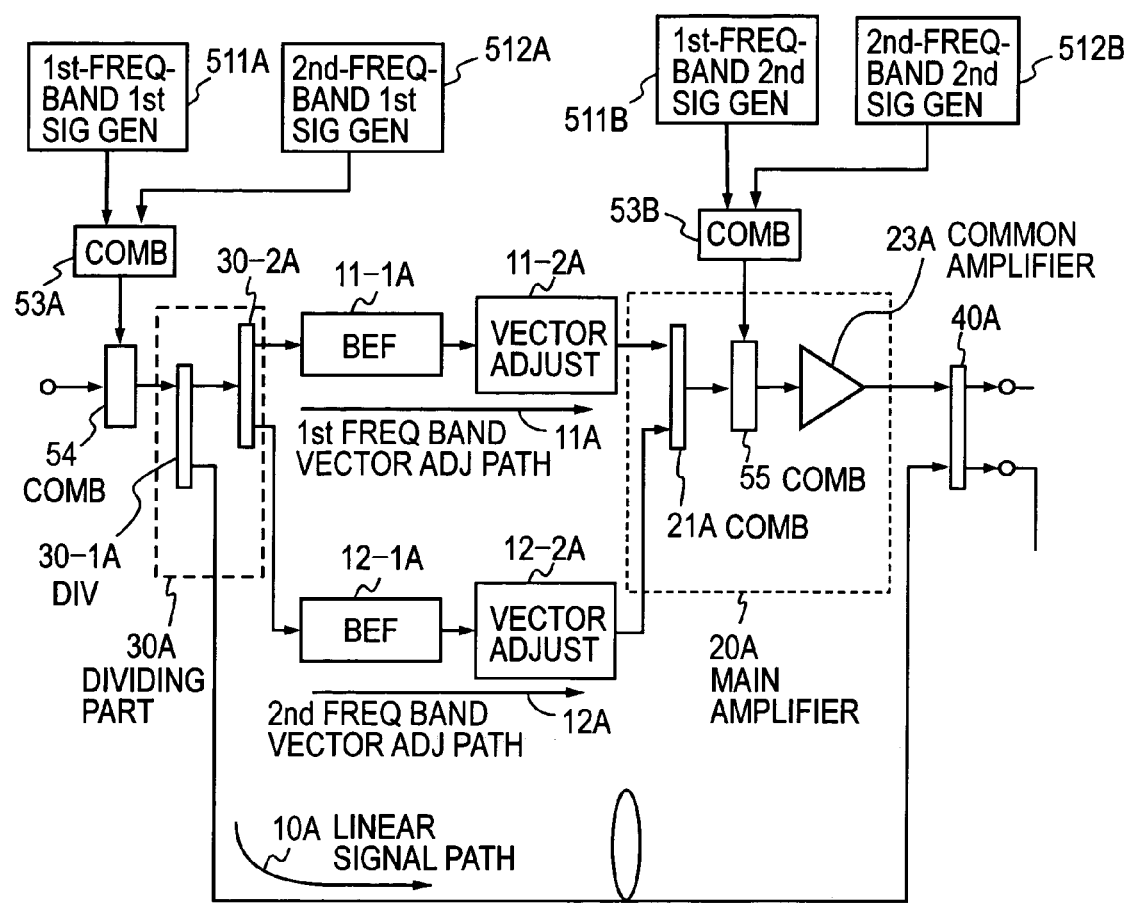
FIG. 23 is a block diagram for explaining an embodiment of a distortion detecting circuit of the feed-forward amplifier according to the present invention.

FIG. 23 illustrates another embodiment of the distortion detecting circuit 100 that employs a different scheme for injecting the pilot signals $P_{f1B}$ and $P_{f2B}$ when the main amplifier 20A is formed by one common amplifier 23A in the embodiments of FIGS. 19 and 20. In this case, a combiner 55 is interposed between the combiner 21A and the common amplifier 23A. The pilot signals $P_{f1B}$ and $P_{f2B}$ from the two second signal generators 511B and 512B are combined by the combiner 53B, and the combined output is input via the combiner 55 to the common amplifier 23A.

Embodiment 16

Figure 24:
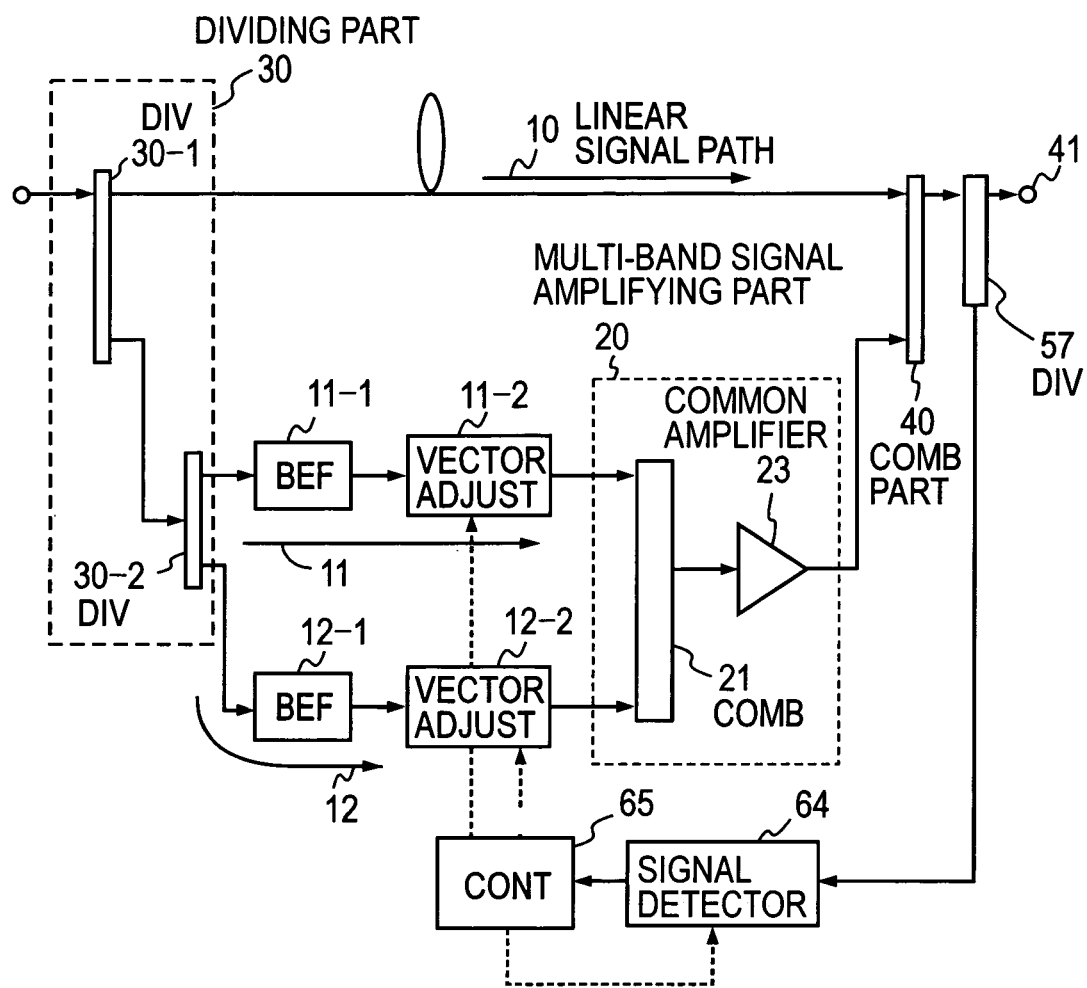
FIG. 24 is a block diagram for explaining another embodiment of the multi-band signal processing circuit applicable to the feed-forward amplifier of the present invention.

FIG. 24 illustrates in block form a modified form of the multi-band signal processing circuit of FIG. 6, which is equipped with a functional configuration for making vector adjustment without using pilot signals. This embodiment is one that has added the FIG. 6 embodiment with: a divider 57 disposed at the output side of the combining part 40; a signal detector 64 for detecting a signal of each frequency band fed from the divider 57; and a controller 65 for controlling the first and second frequency band vector adjusters 11-2 and 12-2 on the basis of the signal detected by the signal detector 64.

Assume that the input signal is composed of two waves of different frequency bands. At the output of the multi-band signal processing circuit the divider 57 extracts multi-band transmission signals and applies them to the signal detector 64. The signal detector 64 is set by the controller 65 to receive a transmission signal of the first frequency band. The signal detector 64 can be formed by an appropriate receiver corresponding to the transmission signal, such as a correlator or coherent detector. The first frequency band transmission signal detected by the signal detector 64 is provided to the controller 65. The controller 65 controls the first frequency band vector adjuster 11-2 to minimize the level of the transmission signal fed to the controller 65.

After completion of controlling the first frequency band vector adjuster 11-2, the controller 65 sets the signal detector 64 to receive a transmission signal of the second frequency band. The controller 65 controls the second frequency band vector adjuster 12-2 to minimize the level of the transmission signal of the second frequency band detected by the signal detector 64.

The first and second frequency band vector adjusters 11-2 and 12-2 are alternately controlled by the controller 65 in such a manner as to minimize the levels of the transmission signals detected at different points in time.

The multi-band signal processing circuit of FIG. 24 is applicable to the distortion detecting circuit 100 and/or distortion cancelling circuit 200 of the feed-forward amplifiers of FIGS. 10, 22 and 12.

Embodiment 17

Figure 25:
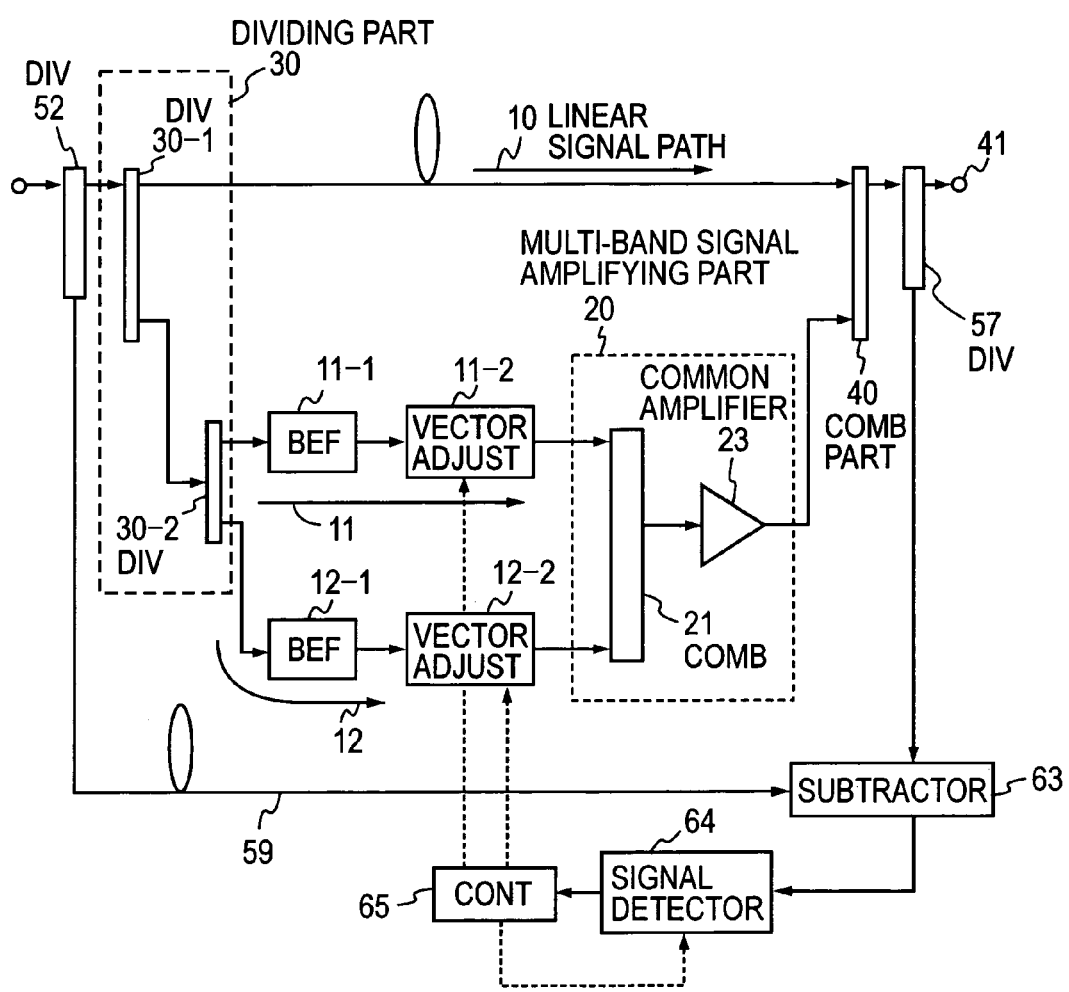
FIG. 25 is a block diagram for explaining another embodiment of the multi-band signal processing circuit applicable to the feed-forward amplifier of the present invention.

FIG. 25 illustrates in block form another embodiment of the present invention, which is a modified form of the FIG. 24 embodiment. This embodiment further includes a divider 52 disposed at the input side of the multi-band signal processing circuit of FIG. 24, a delay line 59 for monitoring the input signal to the multi-band signal processing circuit from one of the divided outputs from the divider 52, and a subtractor 63 that detects from the divided output from the divider 57 the difference between the input to and the output from the multi-band signal processing circuit and provides the difference to the signal detector 64.

By an optimum selection of the electrical length of the delay line 59 and the dividing coefficients of the dividers 52 and 57 provided at the input and output of the multi-band signal processing circuit, only the distortion component generated by the common amplifier 23 can be input to the signal detector 64. An optimum operation of the multi-band signal processing circuit can be achieved for the distortion component by using it as a reference signal for controlling the vector adjusters 11-2 and 12-2 of the respective frequency bands.

Embodiment 18

Figure 26:
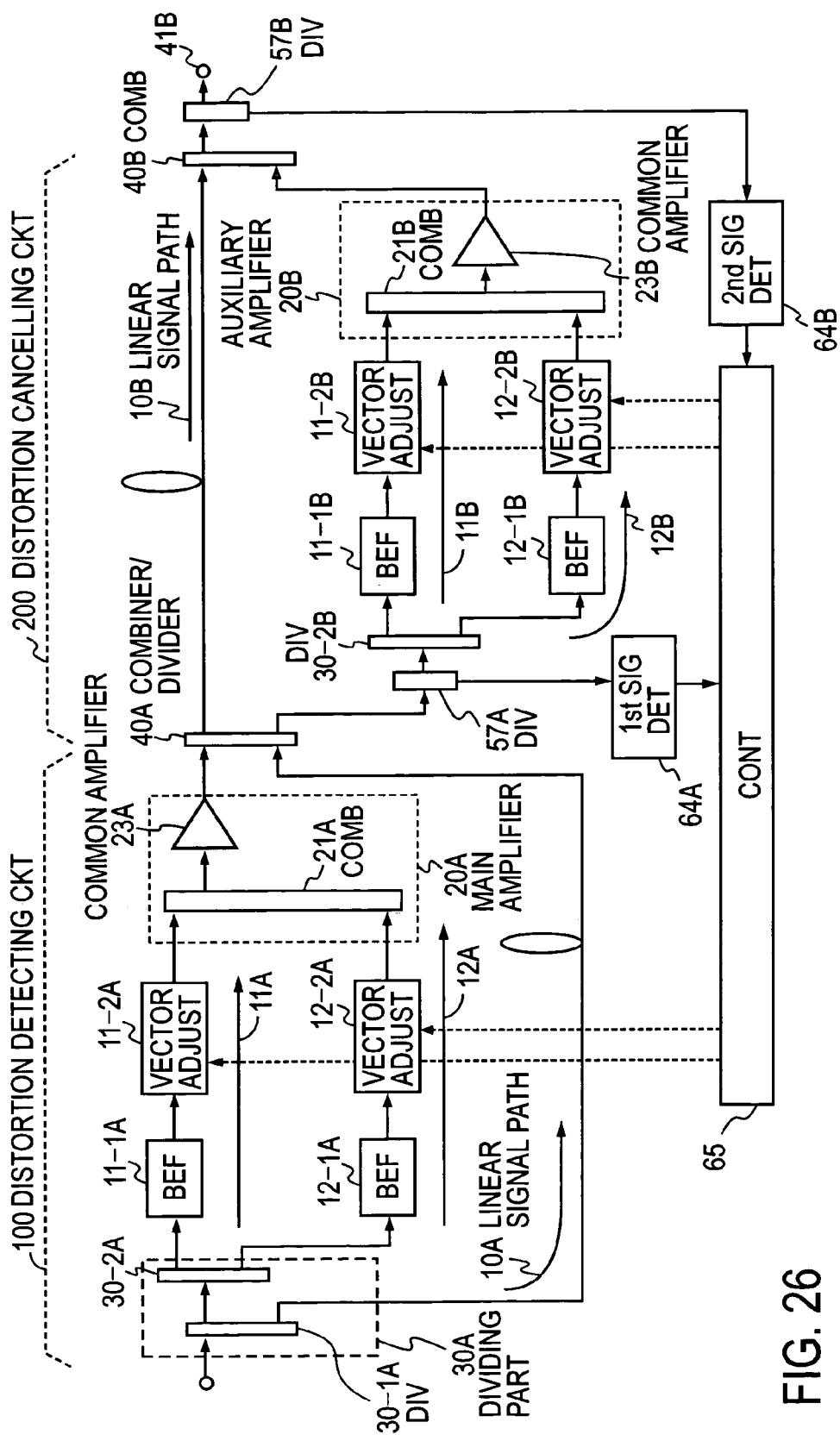
FIG. 26 is a block diagram for explaining another embodiment of the feed-forward amplifier according to the present invention.

FIG. 26 illustrates another embodiment of the feed-forward amplifier of the present invention. This embodiment is a modified form of the FIG. 22 embodiment, which does not use the signal generators 51A and 51B and controls the vector adjusters by use of the transmission signal. Accordingly, the signal generators 51A, 51B, the combiner 54, the switch 56, and the combiners 551, 552 in FIG. 22 are dispensed with in this embodiment. While in the FIG. 22 embodiment the main amplifier 20A and the auxiliary amplifier 20B are formed by the common amplifiers 23A and 23B, respectively, they may also be formed by individual amplifiers for respective frequency bands.

The control scheme in this embodiment is the same as that used in the FIG. 22 embodiment. The use of the common amplifiers 23A and 23B causes a strong possibility of the interdependence of vector adjustment between the first and second frequency bands. To avoid this, the common amplifiers 23A and 23B effect control to minimize the signals to which they make reference as described below.

The first signal detector 64A is supplied with the difference component output from the combiner/divider 40A via the divider 57A. The common controller 65 controls the vector adjusters 11-2A and 12-2A of the distortion detecting circuit 100 so that the output from the first signal detector 64A becomes the distortion component that is developed in the main amplifier 20A. The second signal detector 64B is supplied with the output signal from the feed-forward amplifier via the divider 57B. The common controller 65 controls the vector adjusters 11-2B and 12-2B of the distortion cancelling circuit 200 to minimize the distortion component in the output from the second signal detector 64B. Such control of the vector adjusters permits automatic adjustment of the feed-forward amplifier.

The common controller 65 controls the vector adjusters 11-2A, 12-2A and 11-2B, 12-2B on the basis of the levels of the output signals from the first and second signal detectors 64A and 64B. The common controller 65 controls the vector adjusters of the distortion detecting circuit 100 and the distortion cancelling circuit 200 to satisfy a prescribed value of a predetermined out-band leakage power ratio in the output from the feed-forward amplifier. In this instance, the respective vector adjusters 11-2A, 12-A and 12-2B, 12-2B are not necessarily controlled to minimize the outputs from the first and second signal detectors 64A and 64B. For example, the vector adjusters 11-2A and 12-2A of the distortion detecting circuit 100 makes vector adjustments so that the difference component provided from the combiner/divider 40A to the distortion injection path contains not only the distortion component by the main amplifier 20A but also the transmission signal remain unremoved to some extent. The distortion component and the remained transmission signals are subjected to vector adjustment in the distortion injection paths (the vector adjustment paths) of the distortion cancelling circuit 200, after which they are combined at the combiner 40B with the transmission signal and the distortion component from the linear signal path 10B. Thus, the in-phase combining of the transmission signals and the 180°-out-of-phase combining of the distortion components permit implementation of the vector-adjuster control that provides increased transmission output while at the same time maintaining a predetermined out-band leakage power ratio.

Embodiment 19

Figure 27:
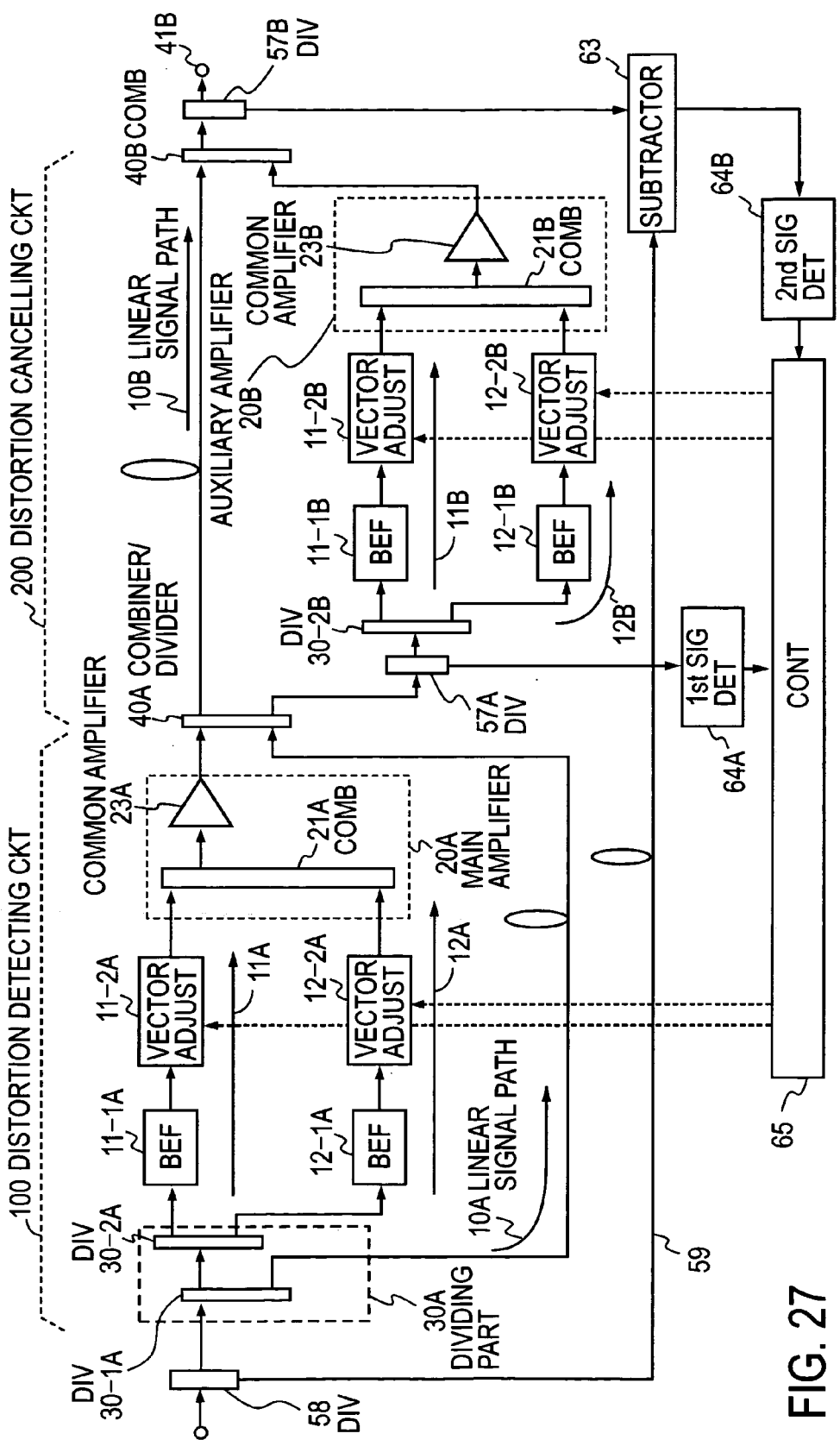
FIG. 27 is a block diagram for explaining still another embodiment of the feed-forward amplifier according to the present invention.

FIG. 27 illustrates in block form still another embodiment. This embodiment is a modified form of the FIG. 26 embodiment, in which there are newly provided: a divider 58 at the input of the feed-forward amplifier; a delay line 59 over which to transmit the input signal to the feed-forward amplifier divided by the divider 58; and a subtractor 63 which detects the difference between the output from the delay line 59 and the divided output from the divider 57B and provides the detected difference to the second signal detector 64B. With such an arrangement, by an optimum selection of the dividing coefficient of the divider 58 for the delay line 59, the input signal to the second signal detector 64B can be used as the distortion component that is output from the feed-forward amplifier. Since the distortion component is detected by the second signal detector 64B, it is easy to control the vector adjusters 11-2B and 12-2B of the distortion cancelling circuit 200 for canceling the distortion component at the output of the feed-forward amplifier.

EFFECT OF THE INVENTION

The multi-band signal processing circuit according to the present invention and the multi-frequency band feed-forward amplifier using the multi-band signal processing circuit can be applied to transmitting amplifiers for mobile communications which transmit signals of multiple frequency bands.

What is claimed is:

1. A feed-forward amplifier having a distortion detecting circuit and a distortion cancelling circuit, wherein:
    said distortion detecting circuit comprises:
        a first linear signal path formed by first delay means;
        N first vector adjustment paths, said N being an integer equal to or greater than 2;
        a first dividing part for dividing the input signal to said distortion detecting circuit into two, the one of which is provided to said first linear signal path and the other of which is provided to said N first vector adjustment paths;
        N first frequency band signal extractors provided in said N first vector adjustment paths, respectively, for extracting signals of N discrete frequency bands;
        N first vector adjusters provided in said N first vector adjustment paths, respectively, for adjusting the phases and amplitudes of the output signals from said first frequency band signal extractors;
        a first multi-band signal amplifying part for amplifying the outputs from said N first vector adjusters, and
        a first combining part for combining the output from said first linear signal path and the output from said first multi-band signal amplifying part; and
    said distortion cancelling circuit comprises:
        a second linear signal path formed by second delay means;
        N second vector adjustment paths;
        N second frequency band signal extractors provided in said N second vector adjustment paths, respectively, for extracting signals of the same frequency bands as those of the signals extracted by said N first frequency band signal extractors;
        N second vector adjusters provided in said N second vector adjustment paths, respectively, for adjusting the phases and amplitudes of the output signals from said N second frequency band signal extractors;
        a second multi-band signal amplifying part for amplifying the outputs from said N second vector adjusters; and
        a second combining part for combining the output from said second linear signal path and the output from said second multi-band signal amplifying part; and
    wherein said first combining part of said distortion detecting circuit is formed by a combiner/divider for providing a sum component of and a difference component between the output from said first linear signal path and the output from said multi-band signal amplifying part to said second linear signal path and said N second vector adjustment paths, respectively.

2. The feed-forward amplifier of claim 1, wherein said first multi-band signal amplifying part includes: N first amplifiers for individually amplifying the outputs from said N first vector adjusters; and a first output combiner for combining the outputs from said first amplifiers and for providing the combined output as the output from said first multi-band signal amplifying part; and wherein said second multi-band signal amplifying part includes: N second amplifiers for individually amplifying the outputs from said N second vector adjusters; and a second output combiner for combining the outputs from said N second amplifiers and for providing the combined output as the output from said second multi-band signal amplifying part.

3. The feed-forward amplifier of claim 1, wherein said multi-band signal amplifying part includes: a first output combiner for combining the outputs from said N first vector adjusters; and a first common amplifier for amplifying the output from said first output combiner and for providing the amplified output as the output from said first multi-band signal amplifying part; and wherein said second multi-band signal amplifying part includes: N second amplifiers for individually amplifying the outputs from said N second vector adjusters; and a second output combiner for combining the outputs from said N second amplifiers and for providing the combined output as the output from said second multi-band signal amplifying part.

4. The feed-forward amplifier of claim 1, wherein said first multi-band signal amplifying part includes: N first amplifiers for individually amplifying the outputs from said N first vector adjusters; and a first output combiner for combining the outputs from said N first amplifiers and for proving the combined output as the output from said first multi-band signal amplifying part; and wherein said second multi-band signal amplifying part includes: a second output combiner for combining the outputs from said N second vector adjusters; and a second common amplifier for amplifying the output from said second output combiner and for providing the amplified output as the output from said second multi-band signal amplifying part.

5. The feed-forward amplifier of claim 1, wherein said first multi-band signal amplifying part includes: a first output combiner for combining the outputs from said N first vector adjusters; and a first common amplifier for amplifying the output from said first output combiner and for providing the amplified output as the output from said first multi-band signal amplifying part; and wherein said second multi-band signal amplifying part includes: a second output combiner for combining the outputs from said N second vector adjusters; and a second common amplifier for amplifying the output from said second output combiner and for providing the amplified output as the output from said second multi-band signal amplifying part.

6. The feed-forward amplifier of any one claims 1 to 5, wherein each of said N first frequency band signal extractor is formed by a cascade connection of N–1 first band elimination filters that eliminate the frequency bands of the other remaining N–1 first frequency band signal extractors, respectively, and each of said N second frequency band signal extractors is formed by a cascade connection of N–1 second band elimination filters that eliminate the frequency bands of the other remaining N–1 second frequency band signal extractors.

7. The feed-forward amplifier of any one of claims 1 to 5, wherein said N first frequency band signal extractors are formed by first band pass filters that use their frequency bands as center frequencies, and said N second frequency band signal extractors are formed by second band pass filters that use their frequency bands as center frequencies.

8. The feed-forward amplifier of any one of claims 1 to 5, which further comprises:
first signal extracting means inserted in the difference component output side of said combiner/divider;
first signal detecting means supplied with the output from said first signal extracting means, for detecting signals of said N frequency bands;
second signal extracting means inserted in the output side of said second combining part;
second signal detecting means supplied with the output from said second signal extracting means, for detecting the signals of said N frequency bands; and
control means supplied with the outputs from said first and second signal detecting means, for controlling said N first vector adjusters and said N second vector adjusters, respectively.

9. The feed-forward amplifier of claim 8, wherein:
said first signal detecting means includes N first signal detectors for detecting signals of said N frequency bands;
said second signal detecting means includes N second signal detectors for detecting signals of said N frequency bands; and
said control means includes: N first controllers for controlling said N first vector adjusters; and N second controllers for controlling said N second vector adjusters.

10. The feed-forward amplifier of claim 8, wherein:
said first signal detecting means includes a first signal detector for detecting signals of said N frequency bands;
said second signal detecting means includes a second signal detector for detecting signals of sand N frequency bands; and
said control means includes: a first controller for controlling said N first vector adjusters; and a second controller for controlling said N second vector adjusters.

11. The feed-forward amplifier off claim 8, wherein:
said first signal detecting means includes N first signal detectors for detecting signals of said N frequency bands; and a first controller for controlling said N first vector adjusters;
said second signal detecting means includes N second signal detectors for detecting signals of said N frequency bands; and
said control means includes: a first controller for controlling said N first vector adjusters; and a second controller for controlling said N second vector adjusters.

12. The feed-forward amplifier of claim 8, wherein:
said first signal detecting means includes N first signal detectors for detecting signals of said N frequency bands;
said second signal detecting means includes N second signal detecting means for detecting signals of said N frequency bands; and
said control means includes a controller for controlling said N first vector adjusters, and supplied with the outputs from said N second signal detectors, for controlling said N second vector adjusters.

13. The feed-forward amplifier of claims 8, wherein:
said first signal detecting means includes a first signal detector for detecting signals of said N frequency bands;
said second signal detecting means includes a second signal detector for detecting signals of said N frequency bands; and
said control means includes a controller for controlling said N first vector adjusters and for controlling said N second vector adjuster.

14. The feed-forward amplifier of claim 8, which further comprises:
N first signal generators for generating first pilot signals of said N frequency bands;
first signal injecting means for injecting the outputs from said N first signal generators into the input to said distortion detecting circuit;
N second signal generators for generating pilot signals of said N frequency bands; and second signal injecting means for injecting the outputs from said N second signal generators into the input to said first multi-frequency band signal amplifying part; and wherein said first signal detecting means detects said N first pilot signals as the signals of said N frequency bands, and said second signal detecting means detects said N second pilot signals as the signals of said N frequency bands.

15. The feed-forward amplifier of claim 8, which further comprises:
   a first signal generator for generating first pilot signals of said N frequency bands;
   first signal injecting means for injecting the output from said first signal generator into the input to said distortion detecting circuit;
   a second signal generator for generating second pilot signals of said N frequency bands; and
   second signal injecting means for injecting the output from said second signal generator into the input to said first multi-band signal amplifying part; and
   wherein said first signal detecting means detects said N first pilot signals as the signals of said N frequency bands, and said second signal detecting means detects said N second pilot signals as the signals of said N frequency bands.

16. The feed-forward amplifier of any claim 8, wherein:
said first signal detecting means detects, as the signals of said N frequency bands, transmission signal components amplified by said first multi-band signal amplifying part.

17. The feed-forward amplifier of claim 8, wherein:
said second signal detecting means detects, as the signals of said N frequency bands, the distortion components generated by said first multi-frequency band signal amplifying part.

18. The feed-forward amplifier of claim 8, wherein:
said control means controls said N first vector adjusters and said N second vector adjusters to minimize the output levels of said first signal detecting means and second signal detecting means, alternately.

19. The feed-forward amplifier of claim 8, wherein:
said control means simultaneously controls said N first vector adjusters and said N second vector adjusters to minimize the output levels of said first signal detecting means and the output levels of said second signal detecting means.

20. A method for adjusting said feed-forward amplifier of claim 1, comprising the steps of:
   (a) detecting the difference component output signal from said distortion detecting circuit, and controlling said N first frequency band vector adjusters to minimize the detected level of said difference component output signal from said distortion detecting circuit; and
   (b) detecting the output signal from said distortion cancelling circuit, and controlling said N second frequency band vector adjusters to minimize the detected level of said output signal from said distortion cancelling circuit.

21. The adjusting method of claim 20, wherein:
said step (a) repeats the sequential control of said N first vector adjusters at least twice or more times.

22. The adjusting method of claim 21, wherein:
said step (b) repeats the sequential control of said N second vector adjusters at least twice or more times.

23. The adjusting method of any one of claims 20 to 22, wherein:
said step (a) includes the steps of: injecting N first pilot signals of said N frequency bands into the input to said distortion detecting circuit; detecting said N first pilot signals in said difference component; and controlling said N first vector adjusters to minimize the levels of said N detected first pilot signals.

24. The adjusting method of 23, wherein:
said step (b) includes the steps of: injecting N second pilot signals of said N frequency bands into said N vector adjustment paths; detecting said N second pilot signals in the output signal from said distortion cancelling circuit; and controlling said N second vector adjusters to minimize the levels of said N detected second pilot signals.

* * * * *